United States Patent
Furuta et al.

(10) Patent No.: US 8,653,912 B2
(45) Date of Patent: Feb. 18, 2014

(54) SWITCHING ELEMENT

(75) Inventors: Shigeo Furuta, Tsukuba (JP); Tsuyoshi Takahashi, Tsukuba (JP); Masatoshi Ono, Tsukuba (JP); Yasuhisa Naitoh, Tsukuba (JP); Tetsuo Shimizu, Tsukuba (JP)

(73) Assignees: Funai Electric Advanced Applied Technology Research Institute Inc., Daito-shi (JP); National Institute of Advanced Industrial Science and Technology, Tokyo (JP); Funai Electric Co., Ltd., Daito-shi (JP)

( * ) Notice: Subject to any disclaimer, the term of this patent is extended or adjusted under 35 U.S.C. 154(b) by 111 days.

(21) Appl. No.: 12/997,316

(22) PCT Filed: Jun. 13, 2008

(86) PCT No.: PCT/JP2008/060914
§ 371 (c)(1),
(2), (4) Date: Dec. 10, 2010

(87) PCT Pub. No.: WO2009/150751
PCT Pub. Date: Dec. 17, 2009

(65) Prior Publication Data
US 2011/0108399 A1 May 12, 2011

(51) Int. Cl.
*H01H 51/22* (2006.01)
*H01H 57/00* (2006.01)

(52) U.S. Cl.
USPC .............................. 335/78; 200/181; 257/414

(58) Field of Classification Search
USPC ............... 335/78–86; 200/181, 572; 257/414, 257/411, 421, 531, 600
See application file for complete search history.

(56) References Cited

U.S. PATENT DOCUMENTS

| | | | | |
|---|---|---|---|---|
| 5,367,136 A * | 11/1994 | Buck | ............................ | 200/600 |
| 6,384,353 B1 * | 5/2002 | Huang et al. | ................. | 200/181 |
| 6,534,839 B1 * | 3/2003 | Frazier et al. | ................. | 257/421 |
| 7,138,331 B2 * | 11/2006 | Park et al. | ..................... | 438/622 |
| 7,902,586 B2 * | 3/2011 | Naitoh et al. | ................. | 257/314 |
| 8,093,518 B2 * | 1/2012 | Naitoh et al. | ................. | 200/267 |
| 2002/0084736 A1 | 7/2002 | Shibata | | |

(Continued)

FOREIGN PATENT DOCUMENTS

| | | |
|---|---|---|
| JP | 5-19295 A | 1/1993 |
| JP | 2005-79335 A | 3/2005 |

(Continued)

OTHER PUBLICATIONS

Charles P. Collier et al., "A [2]Catenane-Based Solid State Electronically Reconfigurable Switch", Science, Aug. 18, 2000, pp. 1172-1175, vol. 289.

(Continued)

*Primary Examiner* — Mohamad Musleh
(74) *Attorney, Agent, or Firm* — Crowell & Moring LLP

(57) ABSTRACT

There is provided a switching element which facilitates integration with higher density and lamination in a device, the switching element including: an insulating substrate; a first electrode provided on the insulating substrate; a second electrode provided above the first electrode; and a between-electrode gap section provided between the first electrode and the second electrode and including a nanometer-scale gap for causing a switching phenomenon of a resistor by applying a prescribed voltage between the first electrode and the second electrode.

14 Claims, 8 Drawing Sheets

(56) References Cited

U.S. PATENT DOCUMENTS

| | | | |
|---|---|---|---|
| 2005/0127524 A1 | 6/2005 | Sakamoto et al. | |
| 2006/0157802 A1 | 7/2006 | Sakamoto et al. | |
| 2007/0018761 A1* | 1/2007 | Yamanaka et al. | 335/78 |
| 2007/0181963 A1* | 8/2007 | Berkcan et al. | 257/415 |
| 2008/0232153 A1* | 9/2008 | Naitoh et al. | 365/148 |
| 2009/0039330 A1* | 2/2009 | Naitoh et al. | 257/2 |
| 2009/0251199 A1 | 10/2009 | Naitoh et al. | |
| 2009/0289371 A1 | 11/2009 | Sakamoto | |

FOREIGN PATENT DOCUMENTS

| | | |
|---|---|---|
| JP | 2005-175164 A | 6/2005 |
| JP | 2006-128438 A | 5/2006 |
| JP | 2007-123828 A | 5/2007 |
| WO | WO 03/028124 A1 | 4/2003 |
| WO | WO 03/094227 A1 | 11/2003 |
| WO | WO 2007037210 A1 * | 4/2007 |
| WO | WO 2007/069725 A1 | 6/2007 |

OTHER PUBLICATIONS

K. Terabe et al., "Quantized conductance atomic switch", Nature, Jan. 6, 2005, pp. 47-50, vol. 433.

International Search Report dated Aug. 5, 2008 including English-language translation (Four (4) pages).

* cited by examiner

SWITCHING ELEMENT

FIELD OF THE INVENTION

The present invention relates to a switching element using nanogap electrodes.

BACKGROUND OF THE ART

Currently, further miniaturization of electric elements is desired in accordance with miniaturization and high densification of devices. As an example of such electric elements, an electric element attracts attention, the electric element in which two electrodes with a minute-gap in between (nanogap electrodes) are used, the minute-gap being bridged by a functional organic molecule. For example, there is known an electric element in which a catenane is deposited on a gap of nanogap electrodes formed by using platinum. (Refer to non-patent document 1, for example.) By applying a voltage to the nanogap electrodes, the catenane is subjected to an oxidation-reduction reaction, so that a switching operation becomes available.

Another electric element also attracts attention, the electric element in which a gap of nanogap electrodes is bridged by a nano-particle. For example, there is known an electric element in which nanogap electrodes are formed by using silver sulfide and platinum, and a silver particle is deposited on a gap of the nanogap electrodes. (Refer to non-patent document 2, for example.) By applying a voltage to the nanogap electrodes, an electrochemical reaction occurs, so that the silver particle is expanded and contracted. Accordingly, the nanogap electrodes can be connected and disconnected, namely, a switching operation becomes available.

However, all of the above-mentioned switching elements need a specific synthetic molecule or a complex metal composite to be deposited on a gap of nanogap electrodes. In addition, since a chemical reaction is used for a switching operation therein, there is a problem that such switching elements easily deteriorate.

Accordingly, a switching element is developed, the switching element made from stable material, which is silicon oxide and gold, by a simple manufacturing method, which is oblique vapor deposition, and capable of stably repeating a switching operation. (Refer to patent document 1, for example.)

Non-Patent Document 1: Science, 289 (2000) 1172-1175
Non-Patent Document 2: Nature, 433 (2005) 47-50
Patent Document 1: Japanese Patent Application Laid-open Publication No. 2005-79335

SUMMARY OF THE INVENTION

The Problem to be Solved by the Invention

However, the above-mentioned switching element is two-dimensionally formed on a flat insulating substrate. Using such a switching element makes integration with higher density and lamination in a device difficult.

An object of the present invention is to provide a switching element which facilitates integration with higher density and lamination in a device.

Means for Solving the Problem

To solve the problem mentioned above, the present invention is a switching element including: an insulating substrate; an insulator provided on an upper surface of the insulating substrate; a first electrode provided on the insulating substrate; a second electrode provided above the first electrode; a between-electrode gap section provided between the first electrode and the second electrode, and including a nanometer-scale gap for causing a switching phenomenon of a resistor by applying a prescribed voltage between the first electrode and the second electrode; and a sealing member to seal the between-electrode gap section off from an air by containing the between-electrode gap section, wherein the first electrode touches a lateral surface of the insulator, the second electrode touches an upper surface and the lateral surface of the insulator, and the between-electrode gap section is provided between the first electrode provided on the lateral surface of the insulator and the second electrode provided on the lateral surface of the insulator.

Further, the present invention is a switching element including: an insulating substrate; a first electrode provided on the insulating substrate; a second electrode provided above the first electrode; and a between-electrode gap section provided between the first electrode and the second electrode, and including a nanometer-scale gap for causing a switching phenomenon of a resistor by applying a prescribed voltage between the first electrode and the second electrode.

The present invention further includes: an insulator provided on an upper surface of the insulating substrate, wherein the first electrode touches a lateral surface of the insulator, the second electrode touches an upper surface and the lateral surface of the insulator, and the between-electrode gap section is provided between the first electrode provided on the lateral surface of the insulator and the second electrode provided on the lateral surface of the insulator.

The present invention further includes: an insulator provided between the first electrode and the second electrode, wherein the second electrode touches an upper surface and a lateral surface of the insulator, and the between-electrode gap section is provided between the first electrode and the second electrode provided on the lateral surface of the insulator.

The present invention further includes: an insulator provided so as to cover the first electrode, and including a hole for exposing a part of an upper surface of the first electrode, wherein the second electrode touches an upper surface of the insulator and an inner surface of the hole, and the between-electrode gap section is provided between the first electrode and the second electrode provided on the inner surface of the hole.

In one aspect of the present invention, the between-electrode gap section is sealed off from an air.

The present invention further includes: an insulator provided so as to cover the first electrode, and including a hole for exposing a part of an upper surface of the first electrode, wherein the second electrode is provided so as to seal the hole off from an air by covering an entrance of the hole, and includes a second electrode projection at a part which covers the entrance of the hole, the second electrode projection projecting to the first electrode, and the between-electrode gap section is provided between the first electrode and the second electrode projection.

In one aspect of the present invention, a tip of the second electrode projection is provided on an inner surface of the hole, and the between-electrode gap section is provided between the first electrode and the tip of the second electrode projection, the tip provided on the inner surface of the hole.

In one aspect of the present invention, the second electrode projection projects to the first electrode, and includes a lower surface which is concave, the first electrode includes a first electrode projection at the part which is exposed by the hole, the first electrode projection projecting to the second electrode and including an upper surface which is concave, an end part of the first electrode projection and an end part of the second electrode projection face to each other in a vertical direction, and the between-electrode gap section is provided between the end part of the first electrode projection and the end part of the second electrode projection.

In one aspect of the present invention, the insulating substrate includes a recess, the first electrode is provided in the recess of the insulating substrate, and includes a first electrode recess on an upper surface, the second electrode is provided so as to seal the first electrode off from an air by covering above the first electrode, and includes a second electrode recess at a part which covers above the first electrode, an end part of the first electrode recess and an end part of the second electrode recess face to each other in a vertical direction, and the between-electrode gap section is provided between the end part of the first electrode recess and the end part of the second electrode recess.

The present invention further includes: an insulator provided so as to cover the first electrode, and including a hole for separating the insulator from the first electrode and for exposing apart of an upper surface of the first electrode, wherein the first electrode includes a first electrode projection on the upper surface, the first electrode projection projecting to the second electrode, the second electrode is provided so as to seal the hole off from an air by covering an entrance of the hole, and the between-electrode gap section is provided between a tip of the first electrode projection and the second electrode.

Advantageous Effects of the Invention

According to the invention, a switching element includes an insulating substrate; an insulator provided on an upper surface of the insulating substrate; a first electrode provided on the insulating substrate; a second electrode provided above the first electrode; and a between-electrode gap section (gap of nanogap electrodes) provided between the first electrode and the second electrode, and including a nanometer-scale gap for causing a switching phenomenon of a resistor by applying a prescribed voltage between the first electrode and the second electrode. Namely, the first electrode which forms the between-electrode gap section, the between-electrode gap section, and the second electrode which forms the between-electrode gap section are disposed in the vertical direction, so that integration with higher density and lamination in a device can be facilitated.

In addition, according to the invention, the first electrode touches a lateral surface of the insulator, the second electrode touches an upper surface and the lateral surface of the insulator, and the between-electrode gap section is provided between the first electrode provided on the lateral surface of the insulator and the second electrode provided on the lateral surface of the insulator. Namely, the switching element is manufactured by performing only the followings: forming the insulator on the upper surface of the insulating substrate; forming an electrode (first and second electrodes) on the upper surface of the insulating substrate and the lateral surface and the upper surface of the insulator; and forming the between-electrode gap section. Hence, the switching element can be easily manufactured.

Moreover, according to the invention, the switching element includes a sealing member to seal the between-electrode gap section off from an air by containing the between-electrode gap section. Namely, the between-electrode gap section is prevented from contacting the air and/or water by the sealing member, so that the switching element can more stably operate.

According to the invention, a switching element includes an insulating substrate; a first electrode provided on the insulating substrate; a second electrode provided above the first electrode; and a between-electrode gap section (gap of nanogap electrodes) provided between the first electrode and the second electrode, and including a nanometer-scale gap for causing a switching phenomenon of a resistor by applying a prescribed voltage between the first electrode and the second electrode. Namely, the first electrode which forms the between-electrode gap section, the between-electrode gap section, and the second electrode which forms the between-electrode gap section are disposed in the vertical direction, so that integration with higher density and lamination in a device can be facilitated.

According to the invention, the switching element further includes an insulator provided on an upper surface of the insulating substrate, wherein the first electrode touches a lateral surface of the insulator, the second electrode touches an upper surface and the lateral surface of the insulator, and the between-electrode gap section is provided between the first electrode provided on the lateral surface of the insulator and the second electrode which is provided on the lateral surface of the insulator. Namely, the switching element is manufactured by performing only the followings: forming the insulator on the upper surface of the insulating substrate; forming an electrode (first and second electrodes) on the upper surface of the insulating substrate and the lateral surface and the upper surface of the insulator; and forming the between-electrode gap section. Hence, in addition to the effect obtained by the invention described in claim 2, an effect can be obtained, the effect which is that the switching element can be easily manufactured.

According to the invention, the switching element includes an insulator provided between the first electrode and the second electrode, wherein the second electrode touches an upper surface and a lateral surface of the insulator, and the between-electrode gap section is provided between the first electrode and the second electrode which is provided on the lateral surface of the insulator. Namely, the switching element is manufactured by performing only the followings: forming an electrode (first electrode) on the upper surface of the insulating substrate; forming the insulator on the upper surface of the electrode; forming an electrode (first and second electrodes) on the lateral surface and the upper surface of the insulator; and forming the between-electrode gap section. Hence, in addition to the effect obtained by the invention described in claim 2, an effect can be obtained, the effect which is that the switching element can be easily manufactured.

According to the invention, the switching element further includes an insulator provided so as to cover the first electrode, and including a hole for exposing a part of an upper surface of the first electrode, wherein the second electrode touches an upper surface of the insulator and an inner surface of the hole, and the between-electrode gap section is provided between the first electrode and the second electrode which is provided on the inner surface of the hole. Namely, the switching element is manufactured by performing only the followings: forming an electrode (first electrode) on the upper surface of the insulating substrate; forming the insulator so as to cover the electrode; forming the hole in the insulator, the hole for exposing a part of the upper surface of the electrode; and forming an electrode (first and second electrodes) on the upper surface of the insulator and the inner surface of the hole.

Hence, in addition to the effect obtained by the invention described in claim 2, an effect can be obtained, the effect which is that the switching element can be easily manufactured.

According to the invention, in the switching element, the between-electrode gap section is sealed off from an air. Namely, the between-electrode gap section is prevented from contacting the air and/or water, so that, in addition to the effects obtained by the invention, effects can be obtained, the effects which are that the switching element can more stably operate, and many options can be given with regard to the material of the first electrode and the second electrode, which form the between-electrode gap section.

According to the invention, in the switching element, the second electrode is provided so as to seal the hole off from an air by covering an entrance of the hole. Namely, the between-electrode gap section is prevented from contacting the air and/or water, so that, in addition to the effect obtained by the invention, effects can be obtained, the effects which are that the switching element can more stably operate, and many options can be given with regard to the material of the first electrode and the second electrode, which form the between-electrode gap section.

In addition, according to the invention, the switching element further includes an insulator provided so as to cover the first electrode, and including a hole for exposing a part of an upper surface of the first electrode, wherein the second electrode is provided so as to cover the entrance of the hole, and includes a second electrode projection at a part which covers the entrance of the hole, the second electrode projection projecting to the first electrode, and the between-electrode gap section is provided between the first electrode and the second electrode projection. Namely, the switching element is manufactured by performing only the followings: forming the first electrode on the upper surface of the insulating substrate; forming the insulator so as to cover the first electrode; forming the hole in the insulator, the hole for exposing a part of the upper surface of the first electrode; and forming the second electrode on the upper surface of the insulator, on the entrance of the hole, and in the hole. Hence, the switching element can be easily manufactured.

According to the invention, in the switching element, the second electrode is provided so as to seal the first electrode off from an air by covering above the first electrode. Namely, the between-electrode gap section is prevented from contacting the air and/or water, so that, in addition to the effect obtained by the invention, effects can be obtained, the effects which are that the switching element can more stably operate, and many options can be given with regard to the material of the first electrode and the second electrode, which form the between-electrode gap section.

In addition, according to the invention, in the switching element, the insulating substrate includes a recess, the first electrode is provided in the recess of the insulating substrate, and includes a first electrode recess provided on an upper surface of the first electrode, the second electrode is provided so as to cover above the first electrode, and includes a second electrode recess at a part which covers above the first electrode, an end part of the first electrode recess and an end part of the second electrode recess face to each other in a vertical direction, and the between-electrode gap section is provided between the end part of the first electrode recess and the end part of the second electrode recess. Namely, the switching element is manufactured by performing only the followings: forming the first electrode in the recess of the insulating substrate; and forming the second electrode so as to cover the first electrode. In addition, an insulator is unnecessary. Hence, the switching element can be easily manufactured.

According to the invention, the switching element further includes an insulator provided so as to cover the first electrode, and including a hole for separating the insulator from the first electrode and for exposing a part of an upper surface of the first electrode, wherein the first electrode includes a first electrode projection on the upper surface, the first electrode projection projecting to the second electrode, the second electrode is provided so as to seal the hole off from an air by covering an entrance of the hole, and the between-electrode gap section is provided between a tip of the first electrode projection and the second electrode. Namely, the between-electrode gap section is prevented from contacting the air and/or water, so that, in addition to the effect obtained by the invention, effects can be obtained, the effects which are that the switching element can more stably operate, and many options can be given with regard to the material of the first electrode and the second electrode, which form the between-electrode gap section.

BEST MODE FOR CARRYING OUT THE INVENTION

In the following, an embodiment of the present invention is described in detail by using the accompanying drawings. However, the scope of the present invention is not limited to the drawings.

Figure 1:
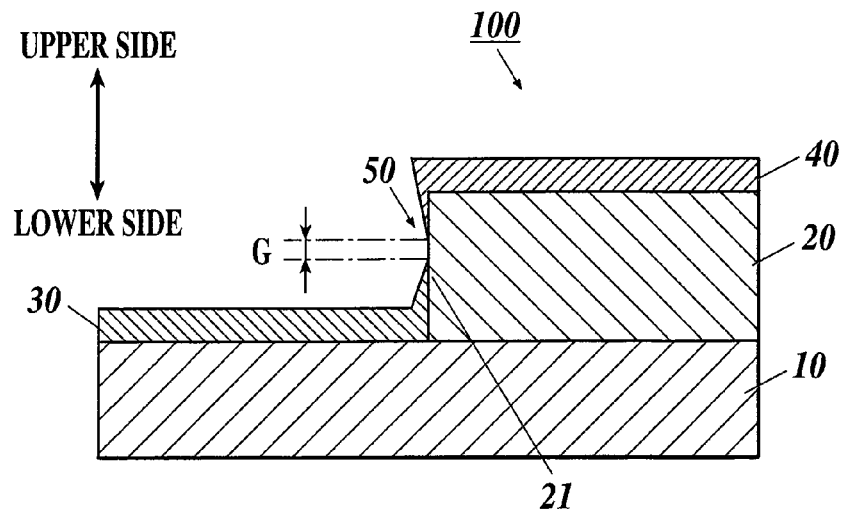
FIG. 1 is a sectional view schematically showing a main part of a switching element according to an embodiment of the present invention.
Figure 2:
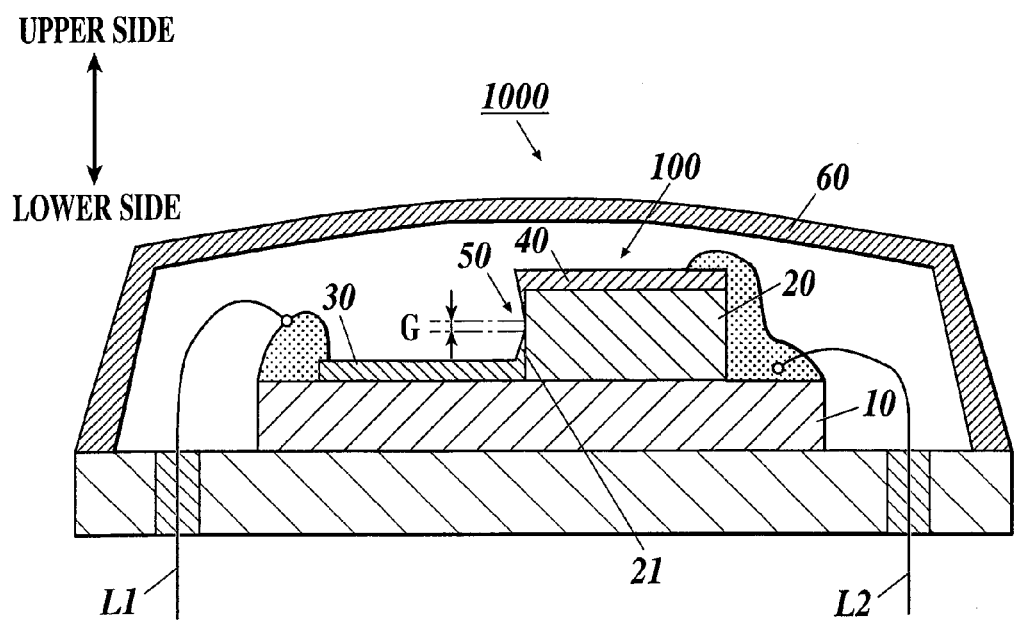
FIG. 2 is a schematic view showing an example of a switching device which is formed by providing the switching element of FIG. 1 with a sealing member.

FIG. 1 is a sectional view schematically showing a main part of a switching element 100 according to an embodiment of the present invention. FIG. 2 is a schematic view showing a switching device 1000 which is formed by providing the switching element 100 of FIG. 1 with a sealing member 60.

The switching element 100 according to the embodiment of the present invention includes, for example, an insulating substrate 10, an insulator 20 provided on the upper surface of the insulating substrate 10, a first electrode 30 provided on the upper surface of the insulating substrate 10, a second electrode 40 provided above the first electrode 30, and a between-electrode gap section 50 provided between the first electrode 30 and the second electrode 40 as shown in FIG. 1.

More specifically, for example, the insulator 20 touches the upper surface of the insulating substrate 10, the first electrode 30 touches the upper surface of the insulating substrate 10 and the lower side of a lateral surface 21 of the insulator 20, the second electrode 40 touches the upper surface of the insulator 20 and the upper side of the lateral surface 21 of the insulator 20, and the between-electrode gap section 50 is provided between the first electrode 30 provided on the lower side of the lateral surface 21 of the insulator 20 and the second electrode 40 provided on the upper side of the lateral surface 21 of the insulator 20.

The insulating substrate 10 makes a support on which an electrode (first electrode 30) of the switching element 100 is provided, for example.

The structure and the material of the insulating substrate 10 are not particularly limited. More specifically, for the shape thereof, a surface of the insulating substrate 10 may be flat or bumpy. The insulating substrate 10 may be a semiconductor substrate such as a Si semiconductor substrate of which an oxide film or the like is provided on a surface, or may be a substrate which has insulating properties per se. For the material of the insulating substrate 10, for example, glass, oxide such as silicon oxide ($SiO_2$), nitride such as silicon nitride ($Si_3N_4$), and the like are preferred, of which $SiO_2$ is most preferred because of its high adhesion to the first electrode 30 and its high degree of freedom in manufacturing.

The insulator 20 makes a support on which two electrodes (the first electrode 30 and the second electrode 40) of the switching element 100 are separately provided from each other, for example.

The structure and the material of the insulator 20 are not particularly limited. More specifically, for example, for the shape thereof, a surface of the insulator 20 may be flat or bumpy as long as the insulator 20 is provided on the upper surface of the insulating substrate 10. The insulator 20 may be formed by providing an oxide film or the like on a part of the insulating substrate 10, or by providing an oxide film or the like on the whole insulating substrate 10 and then removing apart of the provided oxide film or the like. For the material of the insulator 20, for example, glass, oxide such as $SiO_2$, nitride such as $Si_3N_4$, and the like are preferred, of which $SiO_2$ is most preferred because of its high adhesion to the first electrode 30 and the second electrode 40 and its high degree of freedom in manufacturing.

The first electrode 30 is, for example, for performing a switching operation of the switching electrode 100 with the second electrode 40, the first electrode 30 and the second electrode 40 forming a pair.

The shape of the first electrode 30 is not particularly limited, and can be appropriately changed as long as the first electrode 30 is provided on the insulating substrate 10 and touches the lateral surface 21 of the insulator 20.

The material of the first electrode 30 is not particularly limited. For example, it is preferable that the material thereof be at least one of gold, silver, platinum, palladium, nickel, aluminum, cobalt, chrome, rhodium, copper, tungsten, tantalum, and carbon, and alloys made therefrom. Two layers or more which are made from different metals from each other may be used for the first electrode 30, the layers being laminated, in order to increase adhesion to the insulating substrate 10 and the insulator 20, for example. More specifically, the first electrode 30 may have a laminated (multiple-layer) structure, namely, a layer of chrome and a layer of gold may be laminated therein, for example.

The second electrode 40, for example, allows the switching element 100 to perform the switching operation with the first electrode 30, the second electrode 40 and the first electrode 30 forming a pair.

The shape of the second electrode 40 is not particularly limited, and can be appropriately changed as long as the second electrode 40 is provided above the first electrode 30 and touches the upper surface and the lateral surface 21 of the insulator 20.

The material of the second electrode 40 is not particularly limited. For example, it is preferable that the material thereof be at least one of gold, silver, platinum, palladium, nickel, aluminum, cobalt, chrome, rhodium, copper, tungsten, tantalum, and carbon, and alloys made therefrom. Two layers or more which are made from different metals from each other may be used for the second electrode 40, the layers being laminated, in order to increase adhesion to the insulator 20. More specifically, the second electrode 40 may have a laminated (multiple-layer) structure, namely, a layer of chrome and a layer of gold may be laminated therein, for example.

The between-electrode gap section 50 has a nanometer-scale gap for causing a switching phenomenon of a resistor by applying a prescribed voltage between the first electrode 30 and the second electrode 40, for example. The between-electrode gap section 50 has a function to cause the switching phenomenon of the switching element 100.

For the width of the gap which the between-electrode gap section 50 has, namely, for a distance (gap) G between the first electrode 30 and the second electrode 40 (between nanogap electrodes), $0 \text{ nm} < G \leq 13 \text{ nm}$ is preferred, and $0.8 \text{ nm} < G < 2.2 \text{ nm}$ is more preferred, for example.

The reason why the upper limit of the distance G is 13 nm is because, for example, in a case where the first electrode 30 and the second electrode 40 are formed by using oblique vapor deposition so as to form the between-electrode gap section, if the gap is more than 13 nm, the switching phenomenon is not caused.

On the other hand, with regard to the lower limit of the distance G, if the distance G is 0 nm, the first electrode 30 and the second electrode 40 short-circuit. However, according to a graph (FIG. 6, for example) showing a result of measurement of a current-voltage characteristic in a first example, a change is seen around 0 V. Hence, it is obvious that there is a gap which is more than 0 nm. It is difficult to determine the lower limit of the distance G by microscope measurement. However, it can be said that the lower limit of the distance G is the shortest distance which can generate a tunneling current. Namely, the lower limit thereof is a theoretical value of a distance by which when the switching element 100 operates, the current-voltage characteristic does not comply with Ohm's law, and as a result, a quantum-mechanical tunnel effect is observed.

By substituting a resistor value into a theoretical equation for a tunneling current, $0.8 \text{ nm} < G < 2.2 \text{ nm}$ is obtained as a result of the calculation of the gap.

For a direct-current resistance of the between-electrode gap section 50 (resistance between the first electrode 30 and the second electrode 40), more than 1 kΩ and less than 10 TΩ is preferred, and more than 10 kΩ is more preferred, for example.

The reason why the upper limit of the resistance is 10 TΩ is, because, if the resistance is 10 TΩ or more, the switching phenomenon of the switching element 100 is not caused.

On the other hand, the reason why the lower limit of the resistance is 1 KΩ is, because the resistance has not decreased to 1 kΩ or less yet.

In terms of a switch, the higher the resistance is in an OFF state of the switching element 100, the better it is. Hence, it is preferable that the upper limit thereof be as high as possible. On the other hand, if the resistance is 1 KΩ in an ON state of the switching element 100, a milliampere-scale current easily flows. Consequently, another element may be broken. Therefore, for the lower limit thereof, around 10 kΩ is more preferred.

One closest part (between-electrode gap section 50) or more where the first electrode 30 and the second electrode 40 are the closest to each other may be formed, for example, in a region where the first electrode 30 and the second electrode 40 face to each other.

Furthermore, for example, an island part (holm part) made from the material of the first electrode 30, the second electrode 40, and the like may be formed between the first electrode 30 and the second electrode 40. For example, the island part may be formed as long as prescribed gaps (between-electrode gap sections 50) are formed between the first electrode 30 and the island part, and between the second electrode 40 and the island part, so that the first electrode 30 and the second electrode 40 do not short-circuit.

The switching element 100 forms the switching device 1000 by, for example, being contained (sealed off) by the sealing member 60 as shown in FIG. 2.

Lead lines L1 and L2 are connected to the first electrode 30 and the second electrode 40, respectively. The lead lines L1 and L2 are extended to the outside of the sealing member 60. (Refer to FIG. 2.)

The sealing member 60 is, for example, for sealing the between-electrode gap section 50 off from the air so that the switching element 100 more stably operates. The sealing member 60 is provided, for example, so as to contain at least the between-electrode gap section 50, and it is preferable that the sealing member 60 be provided so as to seal the whole switching element 100 including the insulating substrate 10 off from the air.

The shape and the material of the sealing member 60 can be appropriately changed as long as the sealing member 60 has a function to seal the between-electrode gap section 50 off from the air. For the material of the sealing member 60, for example, well-known semiconductor sealing material can be used, and an air-barrier layer composed of a well-known substance and the like may be provided as needed.

When the whole of the first electrode 30 and the second electrode 40 (nanogap electrodes) is, for example, deposited in a proper vacuum chamber (not shown), and used as a switching element, the sealing member 60 is unnecessary.

An inner part of the switching device 1000, the inner part formed by the sealing member 60, can be, for example, a reduced-pressure environment, or can be filled with various substances. For a pressure P of the inner part, $10^{-6}$ Pa<P<2×$10^5$ Pa is preferred, and $10^2$ Pa<P<$10^5$ Pa is more preferred, for example.

With regard to the upper limit of the pressure P, it is confirmed that the switching element 100 operates at up to $10^5$ Pa. However, it is difficult to handle the switching element 100 at a higher pressure than $10^5$ Pa. Hence, it is more preferable that 2×$10^5$ Pa, which is obtained by increasing a pressure a little higher by taking air leak and the like into consideration, be the upper limit thereof.

On the other hand, with regard to the lower limit of the pressure P, it is confirmed that the switching element 100 operates at down to $10^{-6}$ Pa. However, it is difficult to handle the switching element 100 at a lower pressure than $10^{-6}$ Pa. Hence, it is more preferable that $10^2$ Pa, which can be reached by an industrially-easy vacuum system, be the lower limit thereof.

The inner part may be filled with, for example, an inert gas such as dry air, nitrogen, or a rare gas such as Ar, or an electrically-inert organic solvent such as toluene.

Next, a manufacturing method of the switching element 100 is described.

The switching element 100 is manufactured, for example, as follows:

(a) the insulator 20 is formed on the upper surface of the insulating substrate 10;
(b) an electrode pattern P is formed on the upper surface of the insulating substrate 10 and the lateral surface and the upper surface of the insulator 20; and
(c) the first electrode 30 and the second electrode 40 are formed from the electrode pattern P so as to form the between-electrode gap section 50.

More specifically, the switching electrode 100 is manufactured by performing the following processes.

(1) insulating substrate 10 preparation process
(2) insulator 20 deposition process
(3) first resist pattern formation process
(4) insulator 20 etching process
(5) resist pattern release process
(6) second resist pattern formation process
(7) vapor deposition process
(8) liftoff process
(9) electric field break process
(10) sealing process (1) Insulating Substrate 10 Preparation Process For the insulating substrate 10, a Si substrate with an oxide film, a substrate having a surface which is insulated, or the like is used, for example. More specifically, when, for example, an electric conductive substrate such as a Si substrate is used, a desired insulating film is provided on a surface of the Si substrate by a well-known method such as heat treatment, oxidization treatment, vapor deposition, or sputtering, so that the electric conductive substrate with the insulating film can be used as the insulating substrate 10. Furthermore, for example, an insulating substrate such as glass can be used as the insulating substrate 10.

(2) Insulator 20 Deposition Process

The insulator 20 deposition process is performed, for example, by using PECVD (Plasma Enhanced Chemical Vapor Deposition) or the like. The insulator 20 is formed all over the upper surface of the insulating substrate 10.

The thickness of the insulator 20 can be appropriately changed. For example, when a voltage of 10 V is applied between the first electrode 30 and the second electrode 40, 15 nm or more in thickness is preferred.

(3) First Resist Pattern Formation Process

The first resist pattern formation process is performed, for example, by using photolithography or the like, so that a first resist pattern (not shown) for etching a part of the insulator 20 is formed.

The thickness of the first resist pattern can be appropriately changed. More specifically, the thickness thereof is 0.7 μm, for example.

(4) Insulator 20 Etching Process

The insulator 20 etching process is performed, for example, by using a gas which is appropriate to the material of the insulator 20. As a result of performing the insulator 20 etching process, the insulating substrate 10 is exposed at apart where the first resist pattern formed at the first resist pattern formation process does not exist because the insulator 20 corresponding to the part is removed, and the insulator 20 remains at a part where the first resist pattern formed at the first resist pattern formation process exists.

(5) Resist Pattern Release Process

The resist pattern release process is performed, for example, by using a liquid with a release agent which is appropriate to the material of the first resist pattern formed at the first resist pattern formation process. As a result of performing the resist pattern release process, the insulator 20 which remains is exposed, so that an insulator pattern (not shown) is formed.

(6) Second Resist Pattern Formation Process

The second resist pattern formation process is performed, for example, by using photolithography or the like, so that a second resist pattern (not shown) for forming the first electrode 30 and the second electrode 40 is formed.

(7) Vapor Deposition Process

The vapor deposition process is performed, for example, by using a prescribed vapor deposition device, so that the electrode pattern P from which the first electrode 30 and the second electrode 40 are formed is deposited. (Refer to FIG. 3.)

Figure 3:
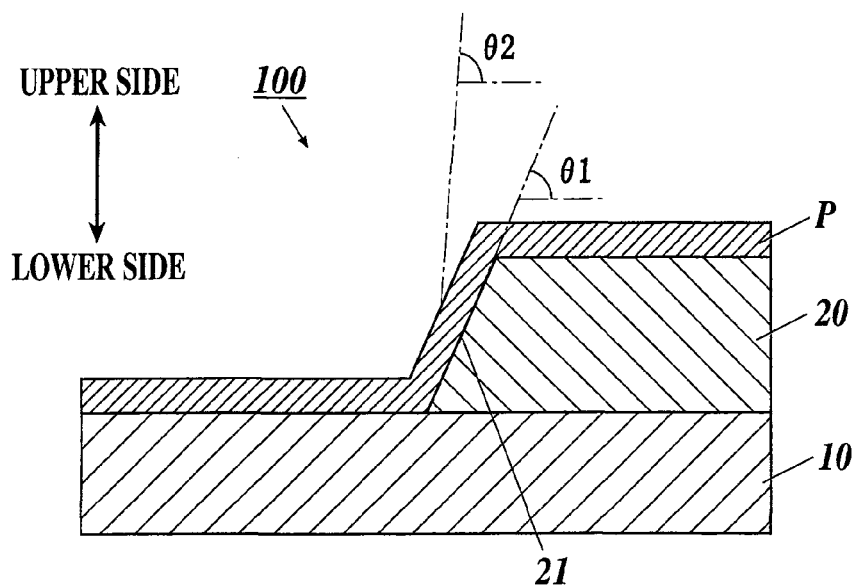
FIG. 3 is a sectional view schematically showing a vapor deposition process in a manufacturing process of the switching element of FIG. 1.

The vapor deposition process is performed, for example, by oblique vapor deposition. Namely, the insulating substrate 10 is deposited in such a way that a come-flying direction of particles of a vapor which evaporates from a vapor supply is oblique to at least one of the lateral surface 21 of the insulator 20 and the respective upper surfaces of the insulating substrate 10 and the insulator 20. More specifically, for example, as shown in FIG. 3, the insulating substrate 10 is deposited in such a way that θ1 and θ2 are 0°<θ1<θ2<180°. Here, θ1 indicates an angle which the upper surface of the insulating substrate 10 and the lateral surface 21 of the insulator 20 make, and θ2 indicates an angle which the upper surface of the insulating substrate 10 and the come-flying direction of the particles of the vapor which evaporates from the vapor supply make. As a result, the electrode pattern P is deposited on the upper surface of the insulating substrate 10 and the lateral substrate 21 and the upper surface of the insulator 20.

The vapor deposition process is performed by depositing, one time or more, at least one substance selected from among gold, silver, platinum, palladium, nickel, aluminum, cobalt, chrome, rhodium, copper, tungsten, tantalum, and carbon, and alloys made therefrom.

The thickness of the electrode pattern P which is deposited can be appropriately changed. For example, it is preferable that, of the electrode pattern P which is deposited, the thickness of a part of the electrode pattern P, the part which is deposited on the lateral surface 21 of the insulator 20, be 10 nm or less, in order to easily perform the electric field break process later.

(8) Liftoff Process

The liftoff process is performed, for example, by using a liquid with a release agent which is appropriate to the material of the second resist pattern formed at the second resist pattern formation process. As a result of performing the liftoff process, the electrode pattern P from which the first electrode 30 and the second electrode 40 are formed later is formed.

(9) Electric Field Break Process

The electric field break process is necessary to be performed since, as shown in FIG. 3, nanogap electrodes short-circuit at the time when the liftoff process ends. Namely, at the electric field break process, the first electrode 30 and the second electrode 40 are separately formed from each other by breaking the electrode pattern P. As a result, the between-electrode gap section 50 is formed.

At the electric field break process, for example, a variable resistor, a fixed resistor, and a power supply (all not shown) are connected to the nanogap electrodes (electrode pattern P), which short-circuit, in series, and a voltage is applied. Then, a resistor value of the variable resistor is adjusted in such a way that the resistance of the variable resistor becomes gradually low, starting from a default value (high resistance). At the time when a current stops flowing, the application of the voltage is stopped. As a result, the first electrode 30 and the second electrode 40 are formed, and nanogap electrodes with a desired between-electrode distance G can be obtained accordingly.

(10) Sealing Process

The sealing process is performed, for example, by utilizing a prescribed hermetic sealing technology. More specifically, the sealing process is performed by ceramic sealing, glass sealing, plastic sealing, or sealing using a metal cap.

The sealing process may be performed in a prescribed atmosphere.

The above-described manufacturing method of the switching element 100 is an example, and hence a manufacturing method of the switching element 100 is not limited thereto.

Figure 4:
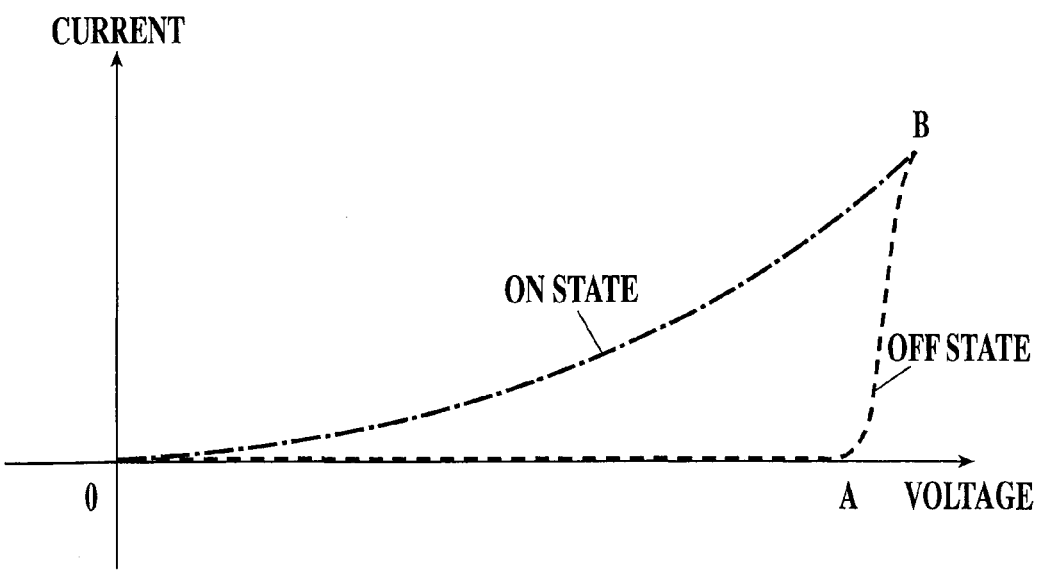
FIG. 4 shows a relationship between a voltage applied between nanogap electrodes of the switching element and a current flowing between the nanogap electrodes.

Next, the switching operation of the switching element 100 is described referring to FIG. 4 and FIG. 5.

FIG. 4 schematically shows an example of a current-voltage curve (curve drawn by a dotted line in FIG. 4) in a case where a voltage applied to the between-electrode gap section 50 (between nanogap electrodes) of the switching element 100 which is in an OFF state is raised from 0 V, and an example of a current-voltage curve (curve drawn by a dashed-dotted line in FIG. 4) in a case where a voltage applied to the between-electrode gap section 50 (between nanogap electrodes) of the switching element 100 which is in an ON state is raised from 0 V. In FIG. 4, the transverse axis corresponds to a voltage applied between nanogap electrodes, and the vertical axis corresponds to a current flowing between the nanogap electrodes. In FIG. 4, alphanumerics "A", "B", and "0", are given for explanation.

FIG. 4 shows the curves in a case where the voltage is positive. In fact, the curves are symmetrical with respect to point 0. Namely, the voltage applied between the nanogap electrodes and the current flowing between the nanogap electrode do not depend on the polarity of the nanogap electrodes. In the following, explanation regarding a case where the voltage is negative is omitted.

First, a difference between the case where the switching element 100 is in the ON state and the case where the switching element is in the OFF state is described with regard to a relationship between the voltage applied to the nanogap electrodes and the current flowing between the nanogap electrodes, referring FIG. 4.

As shown in FIG. 4, in the case where the switching element 100 is in the OFF state, a current flows between the nanogap electrodes when a voltage between point A and point B is applied between the nanogap electrodes.

On the other hand, in the case where the switching element 100 is in the ON state, a current flows between the nanogap electrodes not only when the voltage between point A and point B is applied between the nanogap electrodes but also when a voltage lower than point A is applied between the nanogap electrodes.

Figure 5A:
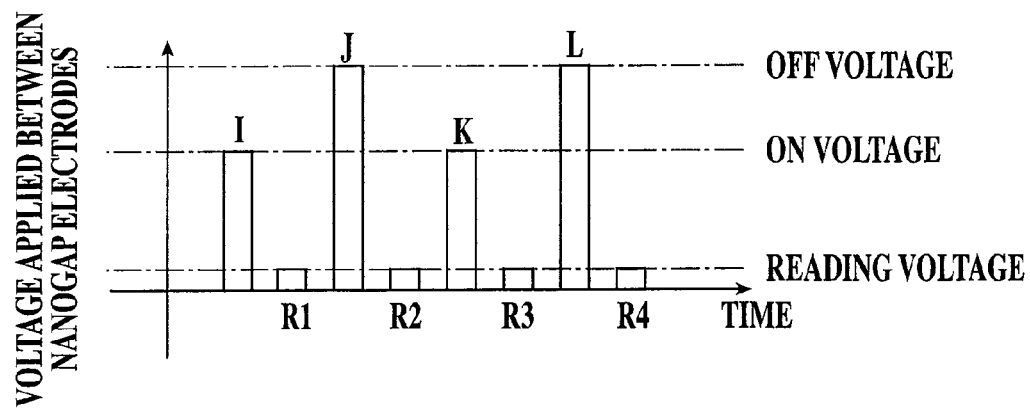
FIG. 5A shows a relationship between an elapsed time and a voltage applied between the nanogap electrodes of the switching element.
Figure 5B:
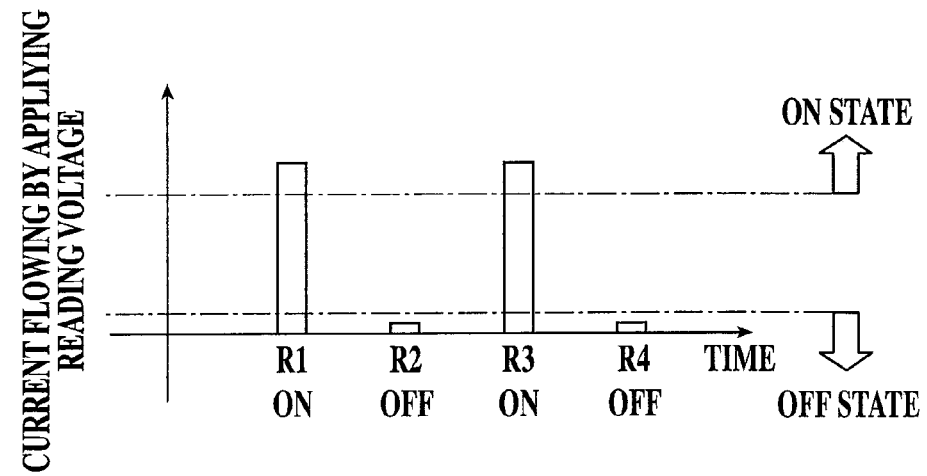
FIG. 5B shows a relationship between the elapsed time and a current flowing between the nanogap electrodes.

Next, the switching operation of the switching element 100 is described referring FIGS. 5A and 5B.

FIG. 5A schematically shows a relationship between an elapsed time and the voltage applied between the nanogap electrodes, and FIG. 5B schematically shows a relationship between the elapsed time and the current flowing between the nanogap electrodes.

As shown in FIGS. 5A and 5B, first, an ON voltage of a square wave pulse I is applied between the nanogap electrodes, and a reading voltage R1 is applied between the nanogap electrodes thereafter (shown in FIG. 5A). Then, a high current flows between the nanogap electrodes, and the state of the switching element 100 becomes the ON state (shown in FIG. 5B).

Next, an OFF voltage of a square wave pulse J is applied between the nanogap electrodes, and a reading voltage R2 is applied between the nanogap electrodes thereafter (shown in FIG. 5A). Then, a current dose not flow between the nanogap electrodes, and the state of the switching element 100 becomes the OFF state (shown in FIG. 5B).

After that, an ON voltage K, an OFF voltage L, the like are applied between the nanogap electrodes in the same manner as the manner described above. Then, the switching element 100 repeats the switching operation so as to be in the ON state and to be in the OFF state in the same manner as the manner described above. Therefore, explanation thereof is omitted.

Next, the present invention is described in detail by giving a first example. However, the scope of the present invention is not limited thereto.

First Example

A manufacturing method of the switching element 100 according to the first example is described.
(1) Insulator 20 Preparation Process As a substrate, a p-type silicon substrate was used. On a surface of the p-type silicon substrate, a silicon oxide layer being 100 nm thick was deposited. The p-type silicon substrate with the silicon oxide layer deposited on the surface thereof was used as the insulating substrate 10.
(2) Insulator 20 Deposition Process Next, a silicon oxide layer being 200 nm thick was deposited on the insulating substrate 10 by PECVD so as to be used as the insulator 20.
(3) First Resist Pattern Formation Process Then, a first resist pattern being 0.7 μm thick was formed.
(4) Insulator 20 Etching Process Next, a part of the insulator 20 was removed by etching using RIE (Reactive Ion Etching), so that a part of the insulating substrate 10, the part corresponding to the removed part of the insulator 20, was exposed.
(5) Resist Pattern Release Process Then, the first resist pattern was released, so that the insulator 20 which remained was exposed.
(6) Second Resist Pattern Formation Process Next, a second resist pattern being 320 nm thick was formed.
(7) Vapor Deposition Process Then, θ2, the angle which the upper surface of the insulating substrate 10 and the come-flying direction of the particles of the vapor which evaporates from the vapor supply make, was set to 90°. The electrode pattern P being 20 nm thick in total at the upper surface of the insulating substrate 10 was deposited by depositing chrome and depositing gold thereafter, a layer of chrome being 1 nm thick at the insulating substrate 10. The thickness of the electrode pattern P at the lateral surface 21 of the insulator 20 was about 5 nm in total.
(8) Liftoff Process Next, the second resist pattern was lifted off.
(9) Electric Field Break Process Then, the electric field break process was performed. The first electrode 30 and the second electrode 40 were formed by breaking the electrode pattern P, and the between-electrode gap section 50 was formed accordingly. More specifically, as a condition for breaking the electric field, an applied voltage was gradually raised from 0 V so that the amount of a current was gradually increased. When the electric field was broken, the amount of the current was 1 mA or less.

The switching element 100 which was manufactured as described above was set in a vacuum chamber. The pressure in the vacuum chamber was in the 1 Pa range, for example.

In the following, a current-voltage (I-V) characteristic in a gap of nanogap electrodes in a case is described referring FIG. 6, the case where a voltage is applied between the first electrode 30 and the second electrode 40, and the voltage is continuously changed.

Figure 6:
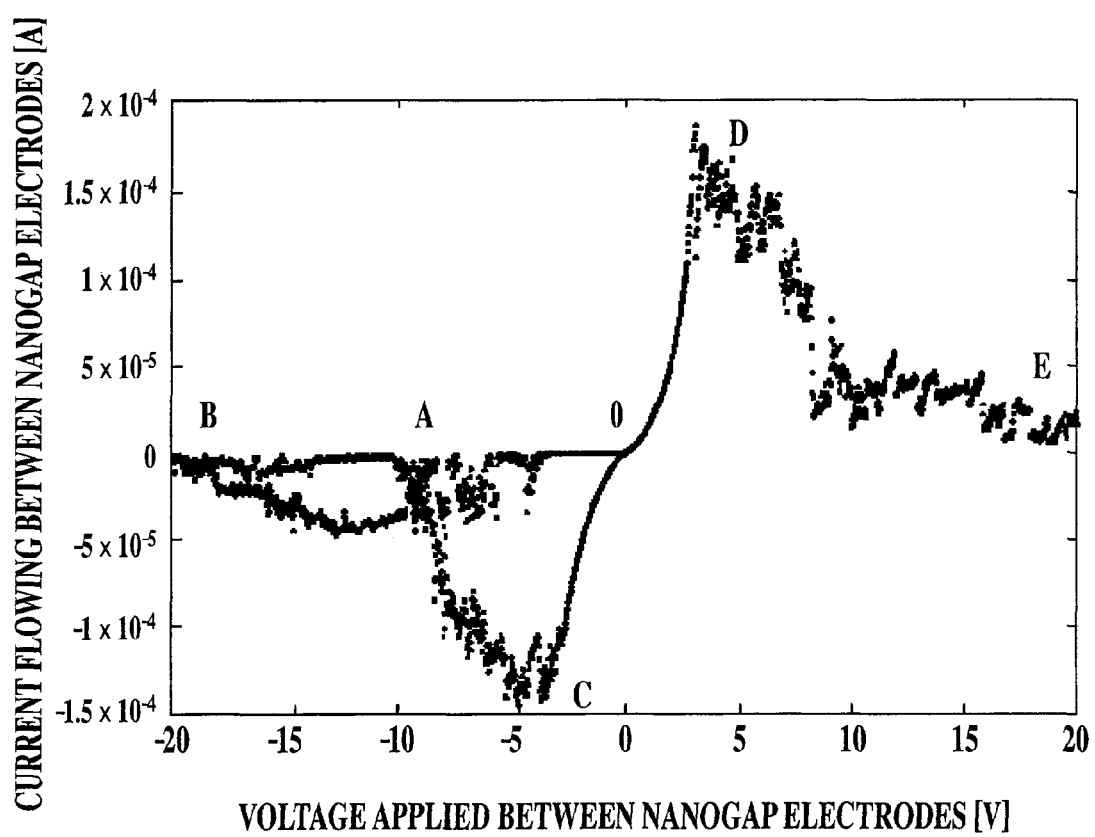
FIG. 6 shows a result of measurement of a current-voltage characteristic in a case where a voltage is applied between the nanogap electrodes.

FIG. 6 shows a result of measurement of the I-V characteristic in the gap of the nanogap electrodes in the case where a voltage is applied between the first electrode 30 and the second electrode 40. The transverse axis is for indicating the voltage which was applied between the nanogap electrodes, and the vertical axis is for indicating the current which flowed between the nanogap electrodes.

First, 0 V was set as a voltage at the start of the measurement, the voltage applied between the nanogap electrodes of the switching element 100 which was in the OFF state. Then, the voltage was continuously applied at −0.2 V/s until reaching −20 V, and then, at 0.2 V/s until reaching 20 V.

More specifically, for example, when explained by using alphahnumerics "A" to "E" and "0" in FIG. 6, the current and the voltage were changed from point 0 to point A to point B to point C to point D to point E.

While the voltage was changed from point 0 to point B, current values of the current were changed only between about 0 A and about $-5\times10^{-5}$ A since the measurement started when the switching element 100 was in the OFF state. Accordingly, a high current did not flow.

By changing the voltage from point B to point C, a current value of the current reached about $-1.5\times10^{-4}$ A, and a current peak was clearly observed (namely, the state of the switching element 100 became the ON state).

By changing the voltage from point C to point D, a current value of the current reached $1.5\times10^{-4}$ A or more, and a current peak was observed, the current peak being the same level as the current peak observed when the voltage was changed from point B to point C.

By changing the voltage from point D to point E, a current value of the current became near 0 A.

FIG. 6 does not show the current-voltage characteristic thereafter. However, a high current did not flow while the voltage was changed from point 0 to point B (namely, the state of the switching element 100 became the OFF state) although the measurement under the same condition was repeated thereafter. Therefore, it was confirmed that, when the condition was the same, the switching element 100 repeated the switching operation, so that the ON state and the OFF state repeatedly changed thereafter as well.

As described above, the switching element 100 according to the embodiment of the present invention includes: the insulating substrate 10; the insulator 20 provided on the upper surface of the insulating substrate 10; the first electrode 30 provided on the insulating substrate 10; the second electrode provided above the first electrode 30; and the between-electrode gap section 50 (gap of nanogap electrodes) provided between the first electrode 30 and the second electrode 40, and including a nanometer-scale gap for causing a switching phenomenon of a resistor by applying a prescribed voltage between the first electrode 30 and the second electrode 40. Namely, the first electrode 30 which forms the between-electrode gap section 50, the between-electrode gap section 50, and the second electrode 40 which forms the between-electrode gap section 50 are disposed in the vertical direction, so that integration with higher density and lamination in a device can be facilitated.

The switching element 100 consists of only the insulating substrate 10, the insulator 20, the first electrode 30, the second electrode 40, and the between-electrode gap section 50. Hence, an organic molecule and/or a nonorganic particle are unnecessary, so that the switching element 100 having a simpler structure can be manufactured.

The switching element 100 does not include a substance which deteriorates, so that the switching operation can be stably repeated.

The switching element 100 has non-volatility, and hence, even when power is not externally supplied after the switching operation starts, the operation state of the switching element 100 can be maintained.

Moreover, in the switching element 100 according to the embodiment of the present invention, the first electrode 30 touches the lateral surface 21 of the insulator 20; the second electrode 40 touches the upper surface of the insulator 10 and the lateral surface 21 of the insulator 20; and the between-electrode gap section 50 is provided between the first electrode 30 provided on the lateral surface 21 of the insulator 20 and the second electrode 40 provided on the lateral surface 21 of the insulator 20. Namely, the switching element 100 is manufactured by performing only the followings: forming the insulator 20 on the upper surface of the insulating substrate 10; forming an electrode (the first electrode 30 and the second electrode 40) on the upper surface of the insulating substrate 10 and the lateral surface 21 and the upper surface of the insulator 20; and forming the between-electrode gap section 50. Hence, the switching element 100 can be easily manufactured.

Furthermore, the switching element 100 according to the embodiment of the present invention further includes the sealing member 60 for sealing the between-electrode gap section 50 off from the air by containing the between-electrode gap section 50. Namely, the between-electrode gap section 50 is prevented from contacting the air and/or water by the sealing member 60, so that the switching element 100 can more suitably operate.

More specifically, the between-electrode gap section 50 (gap of nanogap electrodes) can be prevented from contacting the air and/or water by making the inner part, which is formed by the sealing member 60, a reduced-pressure environment, or by filling the inner part with various substances, for example, an inert gas such as dry air, nitrogen, or a rare gas such as Ar, or an electrically-inert organic solvent such as toluene. Accordingly, the switching operation can be more stable.

The present invention is not limited to the embodiment, and hence various modifications and design changes may be carried out within a range which does not depart from the scope of the present invention.

The shape of the switching element 100 is not particularly limited, and can be appropriately changed as long as the switching element 100 includes: the insulating substrate 10; the first electrode 30 provided on the insulating substrate 10; the second electrode 40 provided above the first electrode 30; and the between-electrode gap section 50 provided between the first electrode 30 and the second electrode 40, and including a nanometer-scale gap for causing a switching phenomenon of a resistor by applying a prescribed voltage between the first electrode 30 and the second electrode 40, namely, as long as a part of the first electrode 30, the part which forms the between-electrode gap section 50; a part of the second electrode 40, the part which forms the between-electrode gap section 50; and the between-electrode gap section 50 are disposed in the vertical direction.

More specifically, the switching element 100 may be a switching element according to any one of first to seventh modifications described below and the like.

[First Modification]

Figure 7:
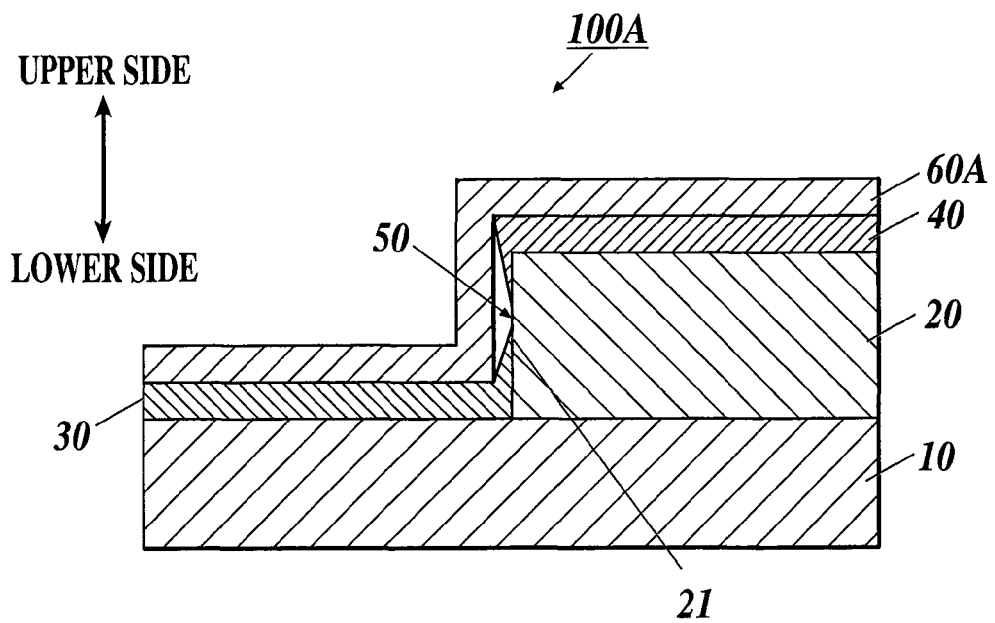
FIG. 7 is a sectional view schematically showing a main part of a switching element according to a first modification.

A switching element 100A according to the first modification includes, for example, the insulating substrate 10, the insulator 20, the first electrode 30, the second electrode 40, the between-electrode gap section 50, and a sealing insulator 60A as shown in FIG. 7.

The sealing insulator 60A is, for example, for sealing the between-electrode gap section 50 off from the air in order to make the switching element 100A more stably operate.

More specifically, the sealing insulator 60A is provided, for example, in such a way that the between-electrode gap section 50 is covered but the gap of the between-electrode gap section 50 is kept without being filled in.

The structure and the material of the sealing insulator 60A are not particularly limited. More specifically, for example, the shape of the sealing insulator 60A is not particularly limited, and can be appropriately changed as long as the sealing insulator 60A is provided in such a way that the between-electrode gap section 50 is covered but the gap of the between-electrode gap section 50 is kept without being filled in. For the material of the sealing insulator 60A, for example, glass, oxide such as $SiO_2$, nitride such as $Si_3N_4$, and the like are preferred, of which $SiO_2$ is most preferred because of its high adhesion to the first electrode 30 and the second electrode 40, and its high degree of freedom in manufacturing.

The switching element 100A according to the first modification is manufactured, for example, as follows:
(a) the insulator 20 is formed on the upper surface of the insulating substrate 10;
(b) the electrode pattern P is formed on the upper surface of the insulating substrate 10 and the lateral surface 21 and the upper surface of the insulator 20;
(c) the first electrode 30 and the second electrode 40 are formed from the electrode pattern P, so that the between-electrode gap section 50 is formed;
(d) a gap forming member for keeping the gap of the between-electrode gap section 50 without being filled in is formed at a position which faces to the lateral surface 21 of the insulator 20;
(e) the sealing insulator 60A is formed on the upper surface of the first electrode 30, a surface of the gap forming member, and the upper surface of the second electrode 40; and
(f) the gap forming member is pyrolyzed.

For the gap forming member, for example, a substance such as an organic substance which is easily pyrolyzed is preferred.

The above-described manufacturing method of the switching element 100A is an example, and hence the manufacturing method thereof is not limited thereto.

In the switching element 100A according to the first modification, the between-electrode gap section 50 is sealed off from the air by the sealing insulator 60A. Hence, the switching element 100A can be used as a switching element without being contained by the sealing member 60 or being set in the vacuum chamber (not shown) like the switching element 100 according to the embodiment described above, for example.

The switching element 100A according to the first modification can stably repeat the switching operation as the switching element 100 according to the embodiment can.

As described above, in the switching element 100A according to the first modification, the between-electrode gap section 50 is sealed off from the air by the sealing insulator 60A. Namely, the between-electrode gap section 50 is prevented from contacting the air and/or water. Accordingly, the switching element 100A can more stably operate, and many options can be given with regard to the material of the first electrode 30 and the second electrode 40, which form the between-electrode gap section 50.

[Second Modification]

Figure 8:
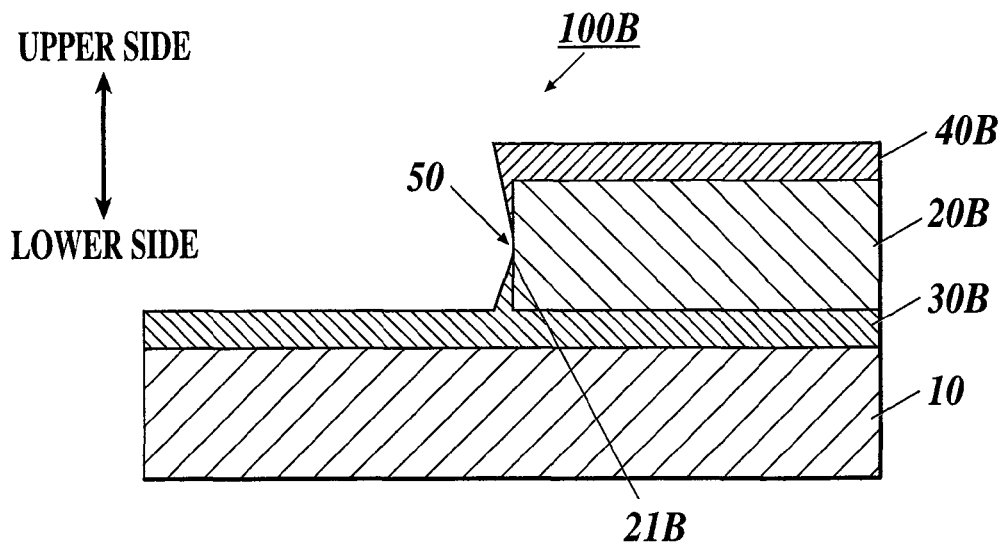
FIG. 8 is a sectional view schematically showing a main part of a switching element according to a second modification.

A switching element 100B according to the second modification includes, for example, the insulating substrate 10, an insulator 20B, a first electrode 30B, a second electrode 40B, and the between-electrode gap section 50 as shown in FIG. 8.

More specifically, the insulator 20B is provided between the first electrode 30B and the second electrode 40B; the first electrode 30B touches the upper surface of the insulating substrate 10, the lower side of a lateral surface 21B of the insulator 20B, and the lower surface of the insulator 20B; the second electrode 40B touches the upper surface of the insulator 20B and the upper side of the lateral surface 21B of the insulator 20B; and the between-electrode gap section 50 is provided between the first electrode 30B, which is provided on the lower side of the lateral surface 21B of the insulator 20B, and the second electrode 40B, which is provided on the upper side of the lateral surface 21B of the insulator 20B.

The shapes of the insulator 20B, the first electrode 30B, and the second electrode 40B are not particularly limited, and can be appropriately changed as long as the insulator 20B is provided between the first electrode 30B and the second electrode 40B, and the second electrode 40B touches the upper surface and the lateral surface 21B of the insulator 20B.

The switching element 100B according to the second modification is manufactured, for example, as follows:

(a) a first electrode pattern is formed on the upper surface of the insulating substrate 10;
(b) the insulator 20B is formed on the upper surface of the first electrode pattern;
(c) a second electrode pattern is formed on the upper surface and the lateral surface 21B of the insulator 20B, the second electrode pattern which touches the first electrode pattern at the lower end of the lateral surface 21B of the insulator 20B; and
(d) the first electrode 30B and the second electrode 40B are formed from the first electrode pattern and the second electrode pattern, so that the between-electrode gap section 50 is formed.

The above-described manufacturing method of the switching element 100B is an example, and hence the manufacturing method thereof is not limited thereto.

When the switching element 100B according to the second modification is used as a switching element, it is preferable that the between-electrode gap section 50 be sealed off from the air, for example, by containing the switching element 100B by the seal member 60 or by setting the switching element 100B in the vacuum chamber (not shown) like the switching element 100 according to the embodiment described above.

The switching element 100B according to the second modification can stably repeat the switching operation as the switching element 100 according to the embodiment can.

As described above, the switching element 100B according to the second modification includes the insulator 20B provided between the first electrode 30B and the second electrode 40B, wherein the second electrode 40B touches the upper surface and the lateral surface 21B of the insulator 20B, and the between-electrode gap section 50 is provided between the first electrode 30B and the second electrode 40B which is provided on the lateral surface 21B of the insulator 20B. Namely, the switching element 100B is manufactured by performing only the followings: forming an electrode (first electrode 30B) on the upper surface of the insulating substrate 10; forming the insulator 20B on the upper surface of the electrode; forming an electrode (the first electrode 30B and the second electrode 40B) on the lateral surface 21B and the upper surface of the insulator 20B; and forming the between electrode gap section 50. Hence, the switching element 100B can be easily manufactured.

[Third Modification]

Figure 9:
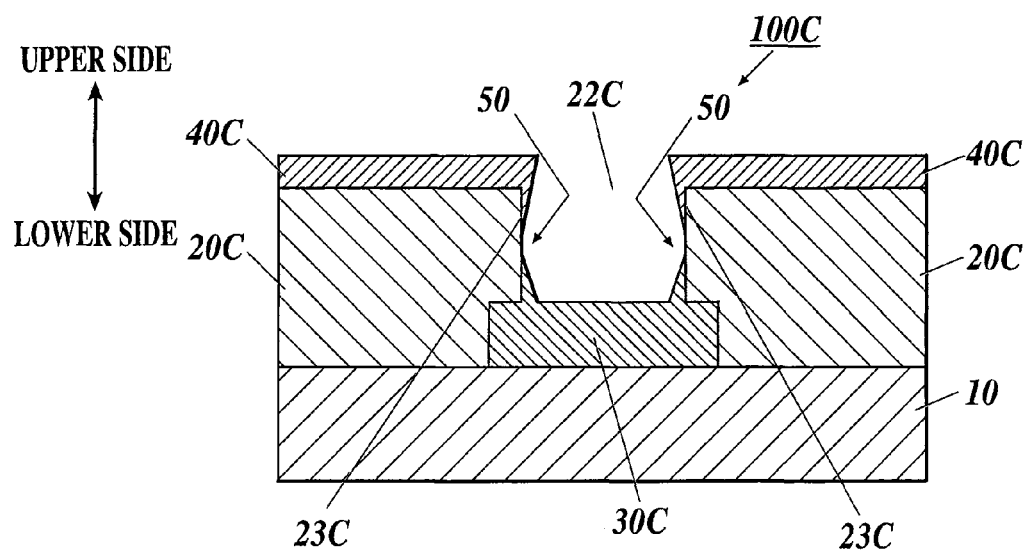
FIG. 9 is a sectional view schematically showing a main part of a switching element according to a third modification.

A switching element 100C according to the third modification includes, for example, the insulating substrate 10, an insulator 20C, a first electrode 30C, a second electrode 40C, and two between-electrode gap sections 50 as shown in FIG. 9.

More specifically, for example, the insulator 20C is provided so as to touch the upper surface of the insulating substrate 10 and to cover the first electrode 30C, and includes a hole 22C for exposing a part of the upper surface of the first electrode 30C. The first electrode 30C is covered with the insulator 20C from the lateral surfaces to the end parts of the upper surface, and touches the upper surface of the insulating substrate 10 and the lower sides of inner surfaces 23C of the hole 22C. The second electrode 40C touches the upper surface of the insulator 20C and the upper sides of the inner surfaces 23C of the hole 22C. The between-electrode gap section 50 is provided between the first electrode 30C, which is provided on the lower sides of the inner surfaces 23C of the hole 22C, and the second electrode 40C, which is provided on the upper sides of the inner surfaces 23C of the hole 22C.

The shapes of the insulator 20C, the first electrode 30C, and the second electrode 40C are not particularly limited, and can be appropriately changed as long as the insulator 20 is provided so as to cover the first electrode 30C, and includes the hole 22C for exposing a part of the upper surface of the first electrode 30C, and the second electrode 40C touches the upper surface of the insulator 20C and the inner surfaces 23C of the hole 22C.

The switching element 100C according to the third modification is manufactured, for example, as follows:

(a) a first electrode pattern is formed on the upper surface of the insulating substrate 10;
(b) the insulator 20C is formed so as to cover the first electrode pattern;
(c) the hole 22C is formed in the insulator 20C, the hole 22C for exposing a part of the upper surface of the first electrode pattern;
(d) a second electrode pattern is formed on the upper surface of the insulator 20C and the inner surfaces 23C of the hole 22C, the second electrode pattern which touches the first electrode pattern at the lower ends of the inner surfaces 23C of the hole 22C; and
(e) the first electrode 30C and the second electrode 40C are formed from the first electrode pattern and the second electrode pattern, so that the between-electrode gap sections 50 are formed.

The above-described manufacturing method of the switching element 100C is an example, and hence the manufacturing method thereof is not limited thereto.

When the switching element 100C according to the third modification is used as a switching element, it is preferable that the between-electrode gap sections 50 be sealed off from the air, for example, by containing the switching element 100C by the seal member 60 or by setting the switching element 100C in the vacuum chamber (not shown) like the switching element 100 according to the embodiment described above.

The switching element 100C according to the third modification can stably repeat the switching operation as the switching element 100 according to the embodiment can.

As described above, the switching element 100C according to the third modification includes the insulator 20C provided so as to cover the first electrode 30C, wherein the insulator 20C includes the hole 22C for exposing a part of the upper surface of the first electrode 300; the second electrode 40 touches the upper surface of the insulator 20C and the inner surfaces 23C of the hole 22C; and the between-electrode gap sections 50 are provided between the first electrode 30C and the second electrode 40C which is provided on the inner surface 23C of the hole 22C. Namely, the switching element 100C is manufactured by performing only the followings: forming an electrode (first electrode 30C) on the upper surface of the insulating substrate 10; forming the insulator 20C so as to cover the electrode; forming the hole 22C in the insulator 20C, the hole 22C for exposing a part of the upper surface of the electrode; forming an electrode (the first electrode 30C and the second electrode 40C) on the upper surface of the insulator 20C and the inner surfaces 23C of the hole 22C; and forming the between-electrode gap sections 50. Therefore, the switching element 100C can be easily manufactured.

[Fourth Modification]

Figure 10:
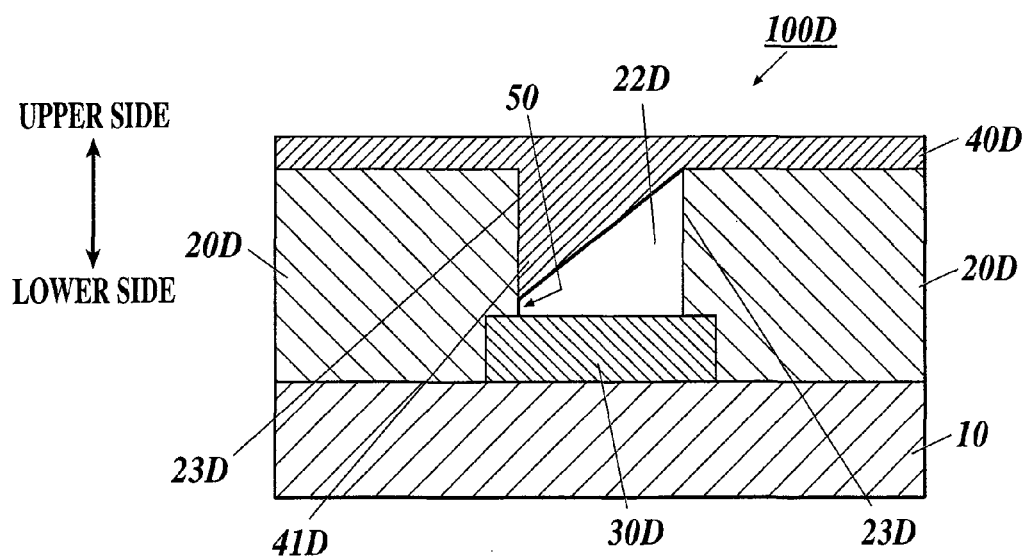
FIG. 10 is a sectional view schematically showing a main part of a switching element according to a fourth modification.

A switching element 100D according to the fourth modification includes, for example, the insulating substrate 10, an insulator 20D, a first electrode 30D, a second electrode 40D, and the between-electrode gap section 50 as shown in FIG. 10.

More specifically, for example, the insulator 20D is provided so as to touch the upper surface of the insulating substrate 10 and to cover the first electrode 30D, and includes a hole 22D for exposing apart of the upper surface of the first electrode 30D. The first electrode 30D is covered with the insulator 20D from the lateral surfaces to the end parts of the upper surface, and touches the upper surface of the insulating substrate 10. The second electrode 40D is provided so as to touch the upper surface of the insulator 20D and to seal the hole 22D off from the air by covering an entrance of the hole 22D, and includes a second electrode projection 41D at a part which covers the entrance of the hole 22D, the second electrode projection which projects to the first electrode 30D. A tip of the second electrode projection 41D is provided on an inner surface 23D of the hole 22D. The between-electrode gap section 50 is provided between the first electrode 30D and the tip of the second electrode projection 41D, the tip provided on the inner surface 23D of the hole 22D.

The shapes of the insulator 20D, the first electrode 30D, and the second electrode 40D are not particularly limited, and can be appropriately changed as long as the insulator 20D is provided so as to cover the first electrode 30D, and includes the hole 22D for exposing a part of the upper surface of the first electrode 30D; and the second electrode 40D is provided so as to seal the hole 22D off from the air by covering the entrance of the hole 22D, and includes the second electrode projection 41D, which projects to the first electrode 30D, at a part which covers the entrance of the hole 22D.

More specifically, for example, the tip of the second electrode projection 41D may be provided other than on the inner surface 23D of the hole 22D. Furthermore, there may be more than one second electrode projection 41D.

The switching element 100D according to the fourth modification is manufactured, for example, as follows:

(a) the first electrode 30D is formed on the upper surface of the insulating substrate 10;

(b) the insulator 20D is formed so as to cover the first electrode 30D;

(c) the hole 22D is formed in the insulator 20D, the hole 22D for exposing a part of the upper surface of the first electrode 30D; and (d) the second electrode 40D is formed on the upper surface of the insulator 20D, on the entrance of the hole 22D, and in the hole 22D by oblique vapor deposition, so that the between-electrode gap section 50 is formed.

The above-described manufacturing method of the switching element 100D is an example, and hence the manufacturing method thereof is not limited thereto.

In the switching element 100D according to the fourth modification, the between-electrode gap section 50 is sealed off from the air by the second electrode 40D. Hence, the switching element 100D can be used as a switching element without being contained by the sealing member 60 or being set in the vacuum chamber (not shown) like the switching element 100 according to the embodiment described above, for example.

The switching element 100D according to the fourth modification can stably repeat the switching operation as the switching element 100 according to the embodiment can.

As described above, in the switching element 100D according to the fourth modification, the second electrode 40D is provided so as to seal the hole 22D off from the air by covering the entrance of the hole 22D. Namely, the between-electrode gap section 50 is prevented from contacting the air and/or water. Therefore, the switching element 100D can more stably operate, and many options can be given with regard to the material of the first electrode 30D and the second electrode 40D, which form the between-electrode gap section 50.

Furthermore, the switching element 100D according to the fourth modification includes the insulator 20D provided so as to cover the first electrode 30D and including the hole 22D for exposing a part of the upper surface of the first electrode 30D, wherein the second electrode 40D is provided so as to cover the entrance of the hole 22D, and includes the second electrode projection 41D, which projects to the first electrode 30D, at a part which covers the entrance of the hole 22D; the tip of the second electrode projection 41D is provided on the inner surface 23D of the hole 22D; and the between-electrode gap section 50 is provided between the first electrode 30D and the tip of the second electrode projection 41D, the tip provided on the inner surface 23D of the hole 22D. Namely, the switching element 100D is manufactured by performing only the followings: forming the first electrode 30D on the upper surface of the insulating substrate 10; forming the insulator 20D so as to cover the first electrode 30D; forming the hole 22D in the insulator 20D, the hole 22D for exposing a part of the upper surface of the first electrode 30D; and forming the second electrode 40D on the upper surface of the insulator 20D, on the entrance of the hole 22D, and in the hole 22D. Therefore, the switching element 100D can be easily manufactured.

[Fifth Modification]

Figure 11:
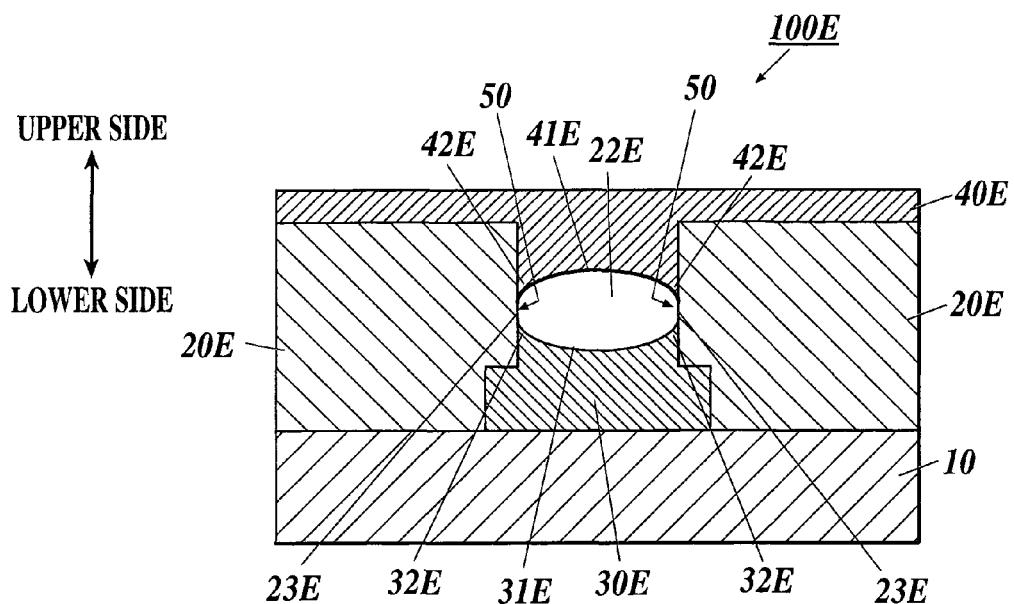
FIG. 11 is a sectional view schematically showing a main part of a switching element according to a fifth modification.
Figure 12:
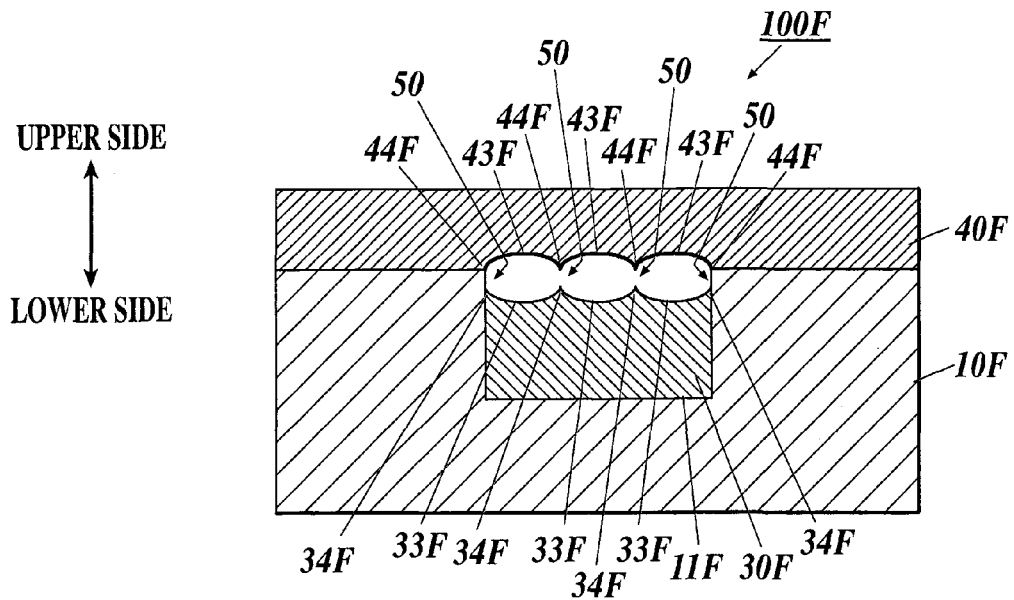
FIG. 12 is a sectional view schematically showing a main part of a switching element according to a sixth modification.

A switching element 100E according to the fifth modification includes, for example, the insulating substrate 10, an insulator 20E, a first electrode 30E, a second electrode 40E, and two between-electrode gap sections 50 as shown in FIG. 11.

More specifically, for example, the insulator 20E is provided so as to touch the upper surface of the insulating substrate 10 and to cover the first electrode 30E, and includes a hole 22E for exposing a part of the upper surface of the first electrode 30E. The first electrode 30E is covered with the insulator 20E from the lateral surfaces to the end parts of the upper surface and touches the upper surface of the insulating substrate 10, and includes a first electrode projection 31E at the part which is exposed by the hole 22E, the first electrode projection 31E which projects to the second electrode 40E, and of which the upper surface is concave. The second electrode 40E is provided so as to touch the upper surface of the insulator 20E and to seal the hole 22E off from the air by covering an entrance of the hole 22E, and includes a second electrode projection 41E at a part which covers the entrance of the hole 22E, the second electrode projection 41E which projects to the first electrode 30E and of which the lower surface is concave. Two end parts 32E of the first electrode projection 31E and two end parts 42E of the second electrode projection 41E are provided on lateral surfaces 23E of the hole 22E in such a way that the end parts 32E and the end parts 42E face to each other, respectively, in the vertical direction. The between-electrode gap sections 50 are provided between the end parts 32E of the first electrode projection 31E, the end parts 32E which are provided on the respective inner surfaces 23E of the hole 22E, and the end parts 42E of the second electrode projection 41E, the end parts 42E which are provided on the respective inner surfaces 23E of the hole 22E, respectively.

The shapes of the insulator 20E, the first electrode 30E, and the second electrode 40E are not particularly limited, and can be appropriately changed as long as the insulator 20E is provided so as to cover the first electrode 30E, and includes the hole 22E for exposing a part of the upper surface of the first electrode 30E; the first electrode 30E includes the first electrode projection 31E at the part which is exposed by the hole 22E, the first electrode projection 31E which projects to the second electrode 40E, and of which the upper surface is concave; the second electrode 40E is provided so as to seal the hole 22E off from the air by covering the entrance of the hole 22E, and includes the second electrode projection 41E at a part which covers the entrance of the hole 22E, the second electrode projection which projects to the first electrode 30E, and of which the lower surface is concave; and the end parts 32E of the first electrode projection 31E and the end parts 42E of the second electrode projection 41E are provided so as to face to each other in the vertical direction, respectively.

More specifically, for example, the end parts 32E of the first electrode projection 31E and the end parts 42E of the second electrode projection 41E may be provided other than on the inner surfaces 23E of the hole 22E. Furthermore, there may be more than one concave part provided on the upper surface of the first electrode projection 31E and more than one concave part provided on the lower surface of the second electrode projection 41E, The switching element 100E according to the fifth modification is manufactured, for example, as follows:

(a) the first electrode 30E is formed on the upper surface of the insulating substrate 10;

(b) the insulator 20E is formed so as to cover the first electrode 30E;

(c) the hole 22E for exposing a part (upper surface of the first electrode projection 31E) of the upper surface of the first electrode 30E is formed in the insulator 20E;

(d) a gap forming member for forming the between-electrode gap sections 50 is formed on the upper surface of the first electrode projection 31E;

(e) the second electrode 40E is formed on the upper surface of the insulator 20E, on the entrance of the hole 22E, and in the hole 22E (on the upper surface of the gap forming member); and (f) the gap forming member is pyrolyzed, so that the between-electrode gap sections 50 are formed.

For the gap forming member, for example, a substance such as an organic substance which is easily pyrolyzed is preferred.

The above-described manufacturing method of the switching element 100E is an example, and hence the manufacturing method thereof is not limited thereto.

In the switching element 100E according to the fifth modification, the between-electrode gap sections 50 are sealed off from the air by the second electrode 40E. Hence, the switching element 100E can be used as a switching element without being contained by the sealing member 60 or being set in the vacuum chamber (not shown) like the switching element 100 according to the embodiment described above, for example.

The switching element 100E according to the fifth modification can stably repeat the switching operation as the switching element 100 according to the embodiment can.

As described above, in the switching element 100E according to the fifth modification, the second electrode 40E is provided so as to seal the hole 22E off from the air by covering the entrance of the hole 22E. Namely, the between-electrode gap sections 50 are prevented from contacting the air and/or water. Therefore, the switching element 100E can more stably operate, and many options can be given with regard to the material of the first electrode 30E and the second electrode 40E, which form the between-electrode gap sections 50.

Furthermore, the switching element 100E according to the fifth modification includes the insulator 20E provided so as to cover the first electrode 30E, and including the hole 22E for exposing a part of the upper surface of the first electrode 30E, wherein the second electrode 40E is provided so as to cover the entrance of the hole 22E, and includes the second electrode projection 41E at a part which covers the entrance of the hole 22E, the second electrode projection 41E which projects to the first electrode 30E, and of which the lower surface is concave; the first electrode 30E includes the first electrode projection 31E at the part which is exposed by the hole 22E, the first electrode projection 31E which projects to the second electrode 40E, and of which the upper surface is concave; the end parts 32E of the first electrode projection 31E and the end parts 42E of the second electrode projection 41E are provided so as to face to each other in the vertical direction, respectively; and the between-electrode gap sections 50 are provided between the end parts 32E of the first electrode projection 31E and the end parts 42E of the second electrode projection 41E, respectively. Namely, the switching element 100E is manufactured by performing only the followings: forming the first electrode 30E on the upper surface of the insulating substrate 10; forming the insulator 20E so as to cover the first electrode 30E; forming the hole 22E in the insulator 20E, the hole 22E for exposing a part of the upper surface of the first electrode 30E; and forming the second electrode 40E on the upper surface of the insulator 20E, on the entrance of the hole 22E, and in the hole 22E. Therefore, the switching element 100E can be easily manufactured.

[Sixth Modification]

A switching element 100F according to the sixth modification includes, for example, an insulating substrate 10F, a first electrode 30F, a second electrode 40F, and four between-electrode gap sections 50.

More specifically, the insulating substrate 10F includes a recess 11F on the upper surface. The first electrode 30F is provided in the recess 11F of the insulating substrate 10F, and includes three first electrode recesses 33F on the upper surface. The second electrode 40F is provided so as to seal the first electrode 30F off from the air by covering above the first electrode 30F and touches the upper surface of the insulating substrate 10F, and includes three second electrode recesses 43F at a part which covers above the first electrode 30F. Four end parts 34F of the first electrode recesses 33F and four end parts 44F of the second electrode recesses 43F face to each other in the vertical direction, respectively. The between-electrode gap sections 50 are provided between the end parts 34F of the first electrode recesses 33F and the end parts 44F of the second electrode recesses 43F, respectively.

The shapes of the insulating substrate 10F, the first electrode 30F, and the second electrode 40F are not particularly limited, and can be appropriately changed as long as the insulating substrate 10F includes the recess 11F; the first electrode 30F is provided in the recess 11F of the insulating substrate 10F, and includes the first electrode recesses 33F on the upper surface; the second electrode 40F is provided so as to seal the first electrode 30F off from the air by covering above the first electrode 30F, and includes the second electrode recesses 43F at a part which covers above the first electrode 30F; and the end parts 34F of the first electrode recesses 33F and the end parts 44F of the second electrode recesses 43F are provided so as to face to each other in the vertical direction, respectively.

More specifically, there may be one first electrode recess 33F or more and one second electrode recess 43F or more.

The switching element 100F according to the sixth modification is manufactured, for example, as follows:
 (a) the first electrode 30F is formed in the recess 11F of the insulating substrate 10F;
 (b) a gap forming member for forming the between-electrode gap sections 50 is formed on the upper surface of the first electrode 30F (upper surfaces of the first electrode recesses 33F);
 (c) the second electrode 40F is formed on the upper surface of the insulating substrate 10F and the upper surface of the gap forming member; and
 (d) the gap forming member is pyrolyzed, so that the between-electrode gap sections 50 are formed.

For the gap forming member, for example, a substance such as an organic substance which is easily prolyzed is preferred.

The above-described manufacturing method of the switching element 100F is an example, and hence the manufacturing method thereof is not limited thereto.

In the switching element 100F according to the sixth modification, the between-electrode gap sections 50 are sealed off from the air by the second electrode 40F. Hence, the switching element 100F can be used as a switching element without being contained by the sealing member 60 or being set in the vacuum chamber (not shown) like the switching element 100 according to the embodiment described above, for example.

The switching element 100F according to the sixth modification can stably repeat the switching operation as the switching element 100 according to the embodiment can.

As described above, in the switching element 100F according to the sixth modification, the second electrode 40E is provided so as to seal the first electrode 30F off from the air by covering above the first electrode 30F. Namely, the between-electrode gap sections 50 are prevented from contacting the air and/or water. Therefore, the switching element 100F can more stably operate, and many options can be given with regard to the material of the first electrode 30F and the second electrode 40F, which form the between-electrode gap sections 50.

Furthermore, in the switching element 100F according to the sixth modification, the insulating substrate 10F includes the recess 11F; the first electrode 30F is provided in the recess 11F of the insulating substrate 10F, and includes the first electrode recesses 33F on the upper surface; the second electrode 40F is provided so as to cover above the first electrode 30F, and includes the second electrode recesses 43F at a part which covers above the first electrode 30F; the end parts 34F of the first electrode recesses 33F and the end parts 44F of the second electrode recesses 43F are provided so as to face to each other in the vertical direction, respectively; and the between-electrode gap sections 50 are provided between the end parts 34F of the first electrode recesses 33F and the end parts 44F of the second electrode recesses 43F, respectively. Namely, the switching element 100F is manufactured by performing only the followings: forming the first electrode 30F in the recess 11F of the insulating substrate 10F; and forming the second electrode 40 so as to cover above the first electrode 30F. In addition, any of the insulators 20, 20A, 20B, 20C, 20D, 20E, and 20G is unnecessary. Therefore, the switching element 100F can be easily manufactured.

[Seventh Modification]

Figure 13:
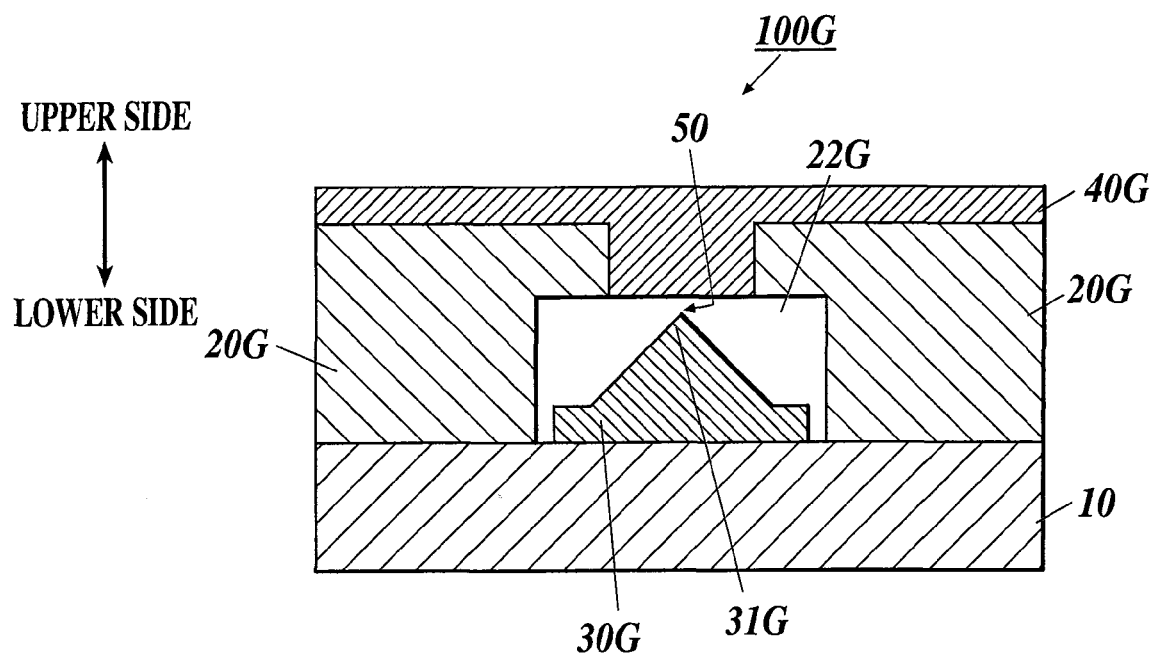
FIG. 13 is a sectional view schematically showing a main part of a switching element according to a seventh modification.

A switching element 100G according to the seventh modification includes, for example, the insulating substrate 10, an insulator 20G, a first electrode 30G, a second electrode 40G, and the between-electrode gap section 50 as shown in FIG. 13.

More specifically, for example, the insulator 20G is provided so as to cover the first electrode 30G, and includes a hole 22G for separating the insulator 20G from the first electrode 30G and for exposing a part of the upper surface of the first electrode 30G. The first electrode 30G touches the upper surface of the insulating substrate 10, and includes a first electrode projection 31G on the upper surface, the first electrode projection 31G which projects to the second electrode 40G. The second electrode 40G is provided so as to touch the upper surface of the insulator 20G and to seal the hole 22G off from the air by covering an entrance of the hole 22G. The between-electrode gap section 50 is provided between a tip of the first electrode projection 31G and a part of the second electrode 40G, the part which covers the entrance of the hole 22G.

The shapes of the insulator 20G, the first electrode 30G, and the second electrode 40G are not particularly limited, and can be appropriately changed as long as the insulator 20G is provided so as to cover the first electrode 30G, and includes the hole 22G for separating the insulator 20G from the first electrode 30G and for exposing a part of the upper surface of the first electrode 30G; the first electrode 30G includes the first electrode projection 31G on the upper surface, the first electrode projection 31G which projects to the second electrode 40G; and the second electrode 40G is provided so as to seal the hole 22G off from the air by covering the entrance of the hole 22G.

More specifically, there may be more than one first electrode projection 31G.

Furthermore, in order to make it easy to apply a voltage to the first electrode 30G, for example, an electric conductive film or the like may be added so that electrical connection between the first electrode 30G and the outside of the switching element 100G can be easy. More specifically, an electric conductive film or the like may be added, for example, the electric conductive film or the like which is deposited from the first electrode 30G to the outside of the switching element 100G, and on the way to the outside of the switching element 100G, deposited between the insulating substrate 10 and the insulator 20G.

In the switching element 100G according to the seventh modification, the between-electrode gap section 50 is sealed off from the air by the second electrode 40G. Hence, the switching element 100G can be used as a switching element without being contained by the sealing member 60 or being set in the vacuum chamber (not shown) like the switching element 100 according to the embodiment described above, for example.

The switching element 100G according to the seventh modification can stably repeat the switching operation as the switching element 100 according to the embodiment can.

As described above, the switching element 100G according to the seventh modification includes the insulator 20G provided so as to cover the first electrode 30G, and including the hole 22G for separating the insulator 20G from the first electrode 30G and for exposing a part of the upper surface of the first electrode 30G, wherein the first electrode 30G includes the first electrode projection 31G on the upper surface, the first electrode projection 31G which projects to the second electrode 40G; the second electrode 40G is provided so as to seal the hole 22G off from the air by covering the entrance of the hole 22G; and the between-electrode gap section 50 is provided between the tip of the first electrode projection 31G and the second electrode 40G. Namely, the between-electrode gap section 50 is prevented from contacting the air and/or water. Therefore, the switching element 100G can more stably operate, and many options can be given with regard to the material of the first electrode 30G and the second electrode 40G, which form the between-electrode gap section 50.

In the embodiment and the first to seventh modifications, a side of the insulating substrates 10 and 10F, the side on which the first electrodes 30 and 30A to 30G and the second electrodes 40 and 40A to 40G are provided, is regarded as the upper side for convenience of explanation. However, it is not a limit. As long as being provided on a side of the insulating substrates 10 and 10F, the first electrodes 30 and 30A to 30G and the second electrodes 40 and 40A to 40G may be provided on the lower side of the insulating substrates 10 and 10F.

The above-described embodiment and first to seventh modifications are examples, and hence the structures of the switching elements 100 and 100A to 100G, the shapes of the sections and the like thereof, and the like are not limited thereto.

DESCRIPTION OF REFERENCE NUMERALS 10, 10F insulating substrate
11F recess
20, 20B, 20C, 20D, 20E, 20G insulator
21, 21B lateral surface
22C, 22D, 22E, 22G hole
23C, 23D inner surface
30, 30B, 30C, 30D, 30E, 30F, 30G first electrode
31E, 31G first electrode projection
32E end part (of the first electrode projection)
33F first electrode recess
34F end part (of the first electrode recess)
40, 40B, 40C, 40D, 40E, 40F, 40G second electrode
41D, 41E second electrode projection
42E end part (of the second electrode projection)
43F second electrode recess
44F end part (of the second electrode recess)
50 between-electrode gap section
60 sealing member
100, 100A, 100B, 100C, 100D, 100E, 100F, 100G switching element

The invention claimed is:

1. A switching element comprising:
an insulating substrate;
an insulator provided on an upper surface of the insulating substrate;
a first electrode provided on the insulating substrate;
a second electrode provided above the first electrode;
a between-electrode gap section provided between the first electrode and the second electrode, and including a nanometer-scale gap for causing a switching phenomenon of a resistor by applying a prescribed voltage between the first electrode and the second electrode; and
a sealing member to seal the between-electrode gap section off from an air by containing the between-electrode gap section, wherein
the first electrode touches a lateral surface of the insulator,
the second electrode touches an upper surface and the lateral surface of the insulator,
the between-electrode gap section is provided between the first electrode provided on the lateral surface of the insulator and the second electrode provided on the lateral surface of the insulator, and
the nanometer-scale gap of the between-electrode gap section has a predetermined length in a vertical direction perpendicular to the surface of the insulating substrate on which the first electrode is provided, the predetermined length corresponding to a distance between the first electrode and the second electrode in the vertical direction.

2. A switching element comprising:
an insulating substrate;
an insulator provided on an upper surface of the insulating substrate;
a first electrode provided on the insulating substrate;
a second electrode provided above the first electrode, the second electrode touching an upper surface of the insulator and a lateral surface of the insulator; and
a between-electrode gap section provided between the first electrode and the second electrode, and including a nanometer-scale gap for causing a switching phenomenon of a resistor by applying a prescribed voltage between the first electrode and the second electrode,
wherein the nanometer-scale gap of the between-electrode gap section has a predetermined length in a vertical direction perpendicular to the surface of the insulating substrate on which the first electrode is provided, the predetermined length corresponding to a distance between the first electrode and the second electrode in the vertical direction.

3. The switching element according to claim 2, wherein
the first electrode touches the lateral surface of the insulator, and
the between-electrode gap section is provided between the first electrode provided on the lateral surface of the insulator and the second electrode provided on the lateral surface of the insulator.

4. The switching element according to claim 2 wherein:
the insulator is provided between the first electrode and the second electrode.

5. The switching element according to claim 2 wherein:
the insulator is provided so as to cover the first electrode, and including a hole for exposing a part of an upper surface of the first electrode,
the second electrode touches the upper surface of the insulator and an inner surface of the hole, and
the between-electrode gap section is provided between the first electrode and the second electrode provided on the inner surface of the hole.

6. The switching element according to claim 2, wherein the between-electrode gap section is sealed off from an air.

7. The switching element according to claim 2 wherein:
the insulator is provided so as to cover the first electrode, and including a hole for exposing a part of an upper surface of the first electrode,
the second electrode is provided so as to seal the hole off from an air by covering an entrance of the hole, and includes a second electrode projection at a part which covers the entrance of the hole, the second electrode projection projecting to the first electrode, and
the between-electrode gap section is provided between the first electrode and the second electrode projection.

8. The switching element according to claim 7, wherein
a tip of the second electrode projection is provided on an inner surface of the hole, and
the between-electrode gap section is provided between the first electrode and the tip of the second electrode projection, the tip provided on the inner surface of the hole.

9. The switching element according to claim 7, wherein
the second electrode projection projects to the first electrode, and includes a lower surface which is concave,
the first electrode includes a first electrode projection at the part which is exposed by the hole, the first electrode projection projecting to the second electrode and including an upper surface which is concave,
an end part of the first electrode projection and an end part of the second electrode projection face to each other in a vertical direction, and
the between-electrode gap section is provided between the end part of the first electrode projection and the end part of the second electrode projection.

10. The switching element according to claim 2, wherein
the insulating substrate includes a recess,
the first electrode is provided in the recess of the insulating substrate, and includes a first electrode recess on an upper surface,
the second electrode is provided so as to seal the first electrode off from an air by covering above the first electrode, and includes a second electrode recess at a part which covers above the first electrode,
an end part of the first electrode recess and an end part of the second electrode recess face to each other in a vertical direction, and
the between-electrode gap section is provided between the end part of the first electrode recess and the end part of the second electrode recess.

11. The switching element according to claim 2 wherein:
an insulator is provided so as to cover the first electrode, and including a hole for separating the insulator from the first electrode and for exposing a part of an upper surface of the first electrode,
the first electrode includes a first electrode projection on the upper surface, the first electrode projection projecting to the second electrode,
the second electrode is provided so as to seal the hole off from an air by covering an entrance of the hole, and
the between-electrode gap section is provided between a tip of the first electrode projection and the second electrode.

12. The switching element according to claim 3, wherein the between-electrode gap section is sealed off from an air.

13. The switching element according to claim 4, wherein the between-electrode gap section is sealed off from an air.

14. The switching element according to claim 5, wherein the between-electrode gap section is sealed off from an air.

* * * * *